United States Patent
Oe

(10) Patent No.: US 6,705,000 B2
(45) Date of Patent: Mar. 16, 2004

(54) DEVICE FOR REMOVABLY MOUNTING SUCTION NOZZLE ON NOZZLE HOLDER

(75) Inventor: Kunio Oe, Chiryu (JP)

(73) Assignee: Fuji Machine Mfg. Co., Ltd., Chiryu (JP)

(*) Notice: Subject to any disclaimer, the term of this patent is extended or adjusted under 35 U.S.C. 154(b) by 166 days.

(21) Appl. No.: 09/981,998

(22) Filed: Oct. 19, 2001

(65) Prior Publication Data

US 2002/0046461 A1 Apr. 25, 2002

(30) Foreign Application Priority Data

Oct. 23, 2000 (JP) .................................... 2000-322353

(51) Int. Cl.⁷ ............................................... B23P 19/00
(52) U.S. Cl. ............................. 29/743; 29/740; 29/739; 29/DIG. 44; 294/2; 294/64.1
(58) Field of Search ........................... 29/743, 740, 741, 29/DIG. 44, 721, 739; 294/2, 64.1; 414/752.1, 737; 901/40

(56) References Cited

U.S. PATENT DOCUMENTS

| | | | |
|---|---|---|---|
| 4,611,397 A | * | 9/1986 | Janisiewicz et al. .......... 29/834 |
| 5,758,410 A | * | 6/1998 | Asai et al. .................... 297/40 |
| 6,012,222 A | * | 1/2000 | Asai et al. .................... 29/832 |
| 2002/0032960 A1 | * | 3/2002 | Lee .............................. 29/743 |
| 2002/0046461 A1 | * | 4/2002 | Oe ............................... 29/743 |

FOREIGN PATENT DOCUMENTS

| | | | |
|---|---|---|---|
| JP | U 61-89435 | 6/1986 | |
| JP | 4-372199 | * 12/1992 | ................. 29/739 |
| JP | A 5-55796 | 3/1993 | |
| JP | A 6-302995 | 10/1994 | |

* cited by examiner

*Primary Examiner*—Carl J. Arbes
*Assistant Examiner*—Minh Trinh
(74) *Attorney, Agent, or Firm*—Oliff & Berridge, PLC

(57) ABSTRACT

A nozzle-mounting device for removably mounting, on a nozzle holder, a suction nozzle for holding an electric component by suction, wherein the nozzle holder includes one of a first fitting portion and a second fitting portion which respectively have an inner circumferential surface and an outer circumferential surface and which are arranged to effect a fitting engagement with each other at the inner and outer circumferential surfaces, while the suction nozzle includes the other of the first and second fitting portions, and one of the first and second fitting portions is provided with a first abutting portion located at an axially intermediate portion of mutually fitting parts of the inner and outer circumferential surfaces, while the other of the first and second fitting portions is provided with a second abutting portion arranged to be brought into abutting contact with the first abutting portion in a direction intersecting the axes of the fitting portions, and wherein a pressing device is provided to force the inner and outer circumferential surfaces against each other by abutting contact of the first abutting portion with the second abutting portion.

14 Claims, 11 Drawing Sheets

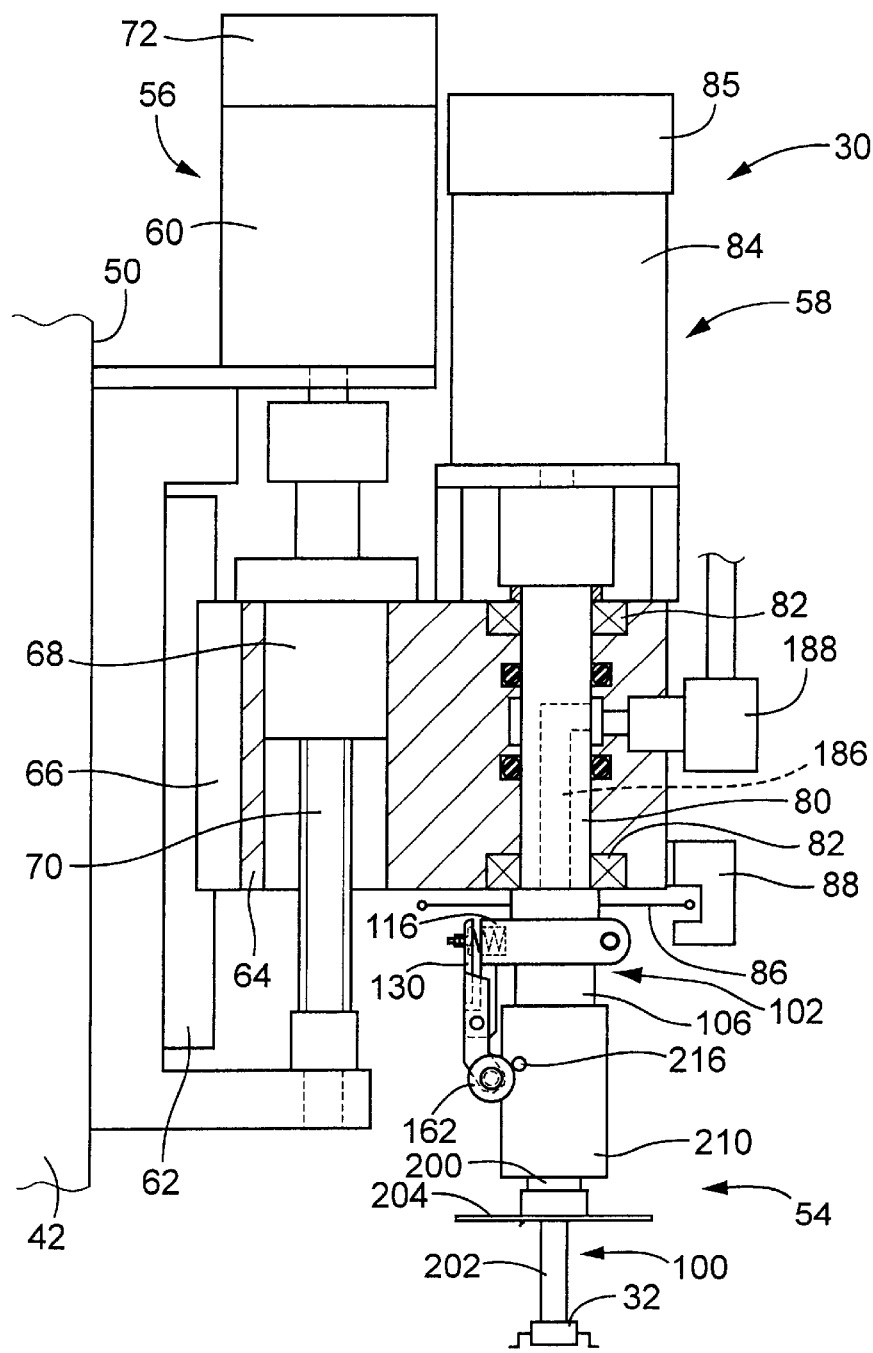
FIG. 3
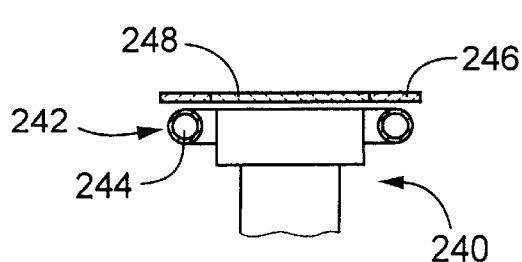

DEVICE FOR REMOVABLY MOUNTING SUCTION NOZZLE ON NOZZLE HOLDER

This application is based on Japanese Patent Application No. 2000-322353 filed on Oct. 23, 2000, the contents of which are incorporated hereinto by reference.

BACKGROUND OF THE INVENTION

1. Field of the Invention

The present invention relates to a nozzle-mounting device for removably mounting, on a nozzle holder, a suction nozzle arranged to hold an electric component (typically, an electronic component) by suction under a negative pressure, and more particularly to an improvement of the nozzle-mounting device in the stability of mounting of the suction nozzle on the nozzle holder.

2. Discussion of Related Art

Various types of nozzle-mounting device are known. JP-A-5-55796 discloses an example of the nozzle-mounting device, which uses sheet springs for mounting a suction nozzle on a nozzle holder. The sheet springs are fixed on the body of the nozzle holder, at respective positions that are spaced from each other in the radial direction of the nozzle holder. Each of the sheet springs is fixed so as to extend downward in the axial direction of the nozzle holder, and includes a holding portion at a relatively low part thereof and a guiding portion extending from the holding portion. The holding portion is inclined with respect to the axial direction, so as to extend toward the axis of rotation of the nozzle holder, while the guiding portion is inclined so as to extend away from the axis of rotation of the nozzle holder. The body of the nozzle holder is further provided with a spring for biasing the suction nozzle in the downward direction.

In the nozzle-mounting device disclosed in the above-identified publication, the body of the suction nozzle includes a fitting portion to be fitted in the body of the nozzle holder. The fitting portion takes the form of a cylinder which is closed and open at the respective opposite ends. The fitting portion has, at its open end, two guide surfaces formed at respective two positions that are spaced apart from each other in the diametric direction, and two inclined surfaces extending from the lower ends of the guide surfaces. The guide surfaces are formed so as to extend in the radially outward directions such that the guide surfaces are parallel to the above-indicated guiding portions of the sheet springs. The inclined surfaces extend toward the axis of rotation of the suction nozzle, and are inclined in parallel with the above-indicated gripping portions of the sheet springs. The suction nozzle is mounted on the nozzle holder, with the fitting portion of the suction nozzle being fitted into the body of the nozzle holder while being guided at its guide surfaces by the guiding portions of the sheet springs, so as to cause elastic deformation of the two sheet springs in opposite directions away from each other. After the inclined surfaces have passed the guiding portions, the fitting portion is biased by the spring provided on the nozzle holder body, so that the inclined surfaces are brought into engagement with the gripping portions of the sheet springs, whereby the suction nozzle is mounted on the nozzle holder such that the suction nozzle is neither axially movable nor rotatable relative to the nozzle holder. The suction nozzle can be removed from the nozzle holder, by pulling the suction nozzle in a direction that permits the fitting portion to be moved out of the body of the nozzle holder. Thus, the use of the sheet springs permits easy mounting and removal of the suction nozzle on and from the nozzle holder, by simply moving the suction nozzle in the axial direction relative to the nozzle holder.

However, a clearance must be left between the fitting portion of the suction nozzle and the body of the nozzle holder, in order to allow fitting engagement of the fitting portion with the nozzle holder body. Thus, there exists a small radial gap between the nozzle holder and the suction nozzle. This radial gap deteriorates the stability of radial positioning of the suction nozzle relative to the nozzle holder, causing problems such as a low degree of accuracy of mounting of an electric component on a printed-wiring board when the electric component held by suction by the suction nozzle is mounted on the printed-wiring board.

SUMMARY OF THE INVENTION

It is therefore an object of the present invention to provide a nozzle-mounting device which permits stable mounting of the suction nozzle on the nozzle holder. The above object may be achieved according to any one of the following modes of the present invention, each of which is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A nozzle-mounting device for removably mounting, on a nozzle holder, a suction nozzle for holding an electric component by suction under a negative pressure, the nozzle-mounting device is characterized in that:

the nozzle holder includes a first fitting portion and a second fitting portion which respectively have an inner circumferential surface and an outer circumferential surface and which are arranged to effect a fitting engagement with each other at the inner and outer circumferential surfaces, while the suction nozzle includes the other of the first and second fitting portions;

one of the first and second fitting portions is provided with a first abutting portion located at an axially intermediate portion of mutually fitting parts of the inner and outer circumferential surfaces, while the other of the first and second fitting portions is provided with a second abutting portion which is arranged to be brought into abutting contact with the first abutting portion in a direction intersecting axes of the first and second fitting portions; and a pressing device is provided to force the inner and outer circumferential surfaces against each other by abutting contact of the first abutting portion with the second abutting portion.

Where both of the first and second abutting portions have abutting surfaces (flat or curved surfaces), the direction of the abutting contact of the first and second abutting portions with each other is normal to the abutting surfaces. Where one of the first and second abutting portions has an abutting surface while the other abutting portion has an abutting corner or edge, the direction of the abutting contact is normal to the abutting surface of the above-indicated one of the two abutting portions. The "first abutting portion located at an axially intermediate portion of mutually fitting parts of the inner and outer circumferential surfaces" may be interpreted to mean that the first abutting portion is located so that a force for forcing the inner and outer circumferential surfaces against each other acts on the axially intermediate portion of the mutually fitting parts of those circumferential surfaces.

For fitting engagement of the inner and outer circumferential surfaces of the first and second fitting portions, it is essential to provide a certain amount of clearance or gap (hereinafter referred to as "fitting clearance") between the inner and outer circumferential surfaces. This fitting clearance is zeroed at a circumferential position of the inner and outer circumferential surfaces at which these circumferential surfaces are forced against each other by application of a force to one of the first and second fitting portions in a direction that intersects the axes of the fitting portions. Further, the application of the force in the direction intersecting the axes of the fitting portions to the first abutting portion located at the axially intermediate portion of the mutually engaging parts of the circumferential surfaces causes close pressing contact of the inner and outer circumferential surfaces with each other on the opposite sides of the axially intermediate portion, that is, along the entire length of the mutually engaging parts, so that an inclination of the axes of the first and second fitting portions with respect to each other can be prevented. Accordingly, a predetermined relative position of the first and second fitting portions in the radial direction is established by the abutting contact of the first and second abutting portions with each other, so that a predetermined relative position of the suction nozzle and the nozzle holder in the radial direction is established, even in the presence of the fitting clearance between the inner and outer circumferential surfaces. Thus, the suction nozzle can be mounted on the nozzle holder with a high degree of stability. The suction nozzle can be positioned in the radial direction with a high degree of positioning accuracy, as if the fitting clearance did not exist, as long as the eccentricity of the suction nozzle with respect to the nozzle holder due to the pressing contact of the inner and outer circumferential surfaces at one circumferential position is taken into account when the suction nozzle is positioned.

Each of the inner and outer circumferential surfaces is typically one cylindrical surface having a constant diameter. However, at least one of the inner and outer circumferential surfaces may have an axially intermediate recessed portion at which the inner and outer circumferential surfaces do not contact each other. In this case, the inner and outer circumferential surfaces are forced against each other along a generating line thereof, except at the axially intermediate recessed portion. Alternatively, each of the inner and outer circumferential surfaces may consist of a plurality of axial portions having different diameters, which are formed to permit the first and second fitting portions to eventually effect the fitting engagement with each other. In this case, the inner and outer circumferential surfaces are eventually forced against each other, along each of generating lines of the respective sets of axial portions of the first and second fitting portions which have the respective different diameters.

The pressing device may include: the first abutting portion fixedly provided on one of the first and second fitting portions; an abutting member functioning as the second abutting portion; a holding device for holding the abutting member such that the abutting member is movable in the direction intersecting the axes of the first and second fitting portions; and a biasing device for biasing the abutting member in a direction toward the first abutting portion. Alternatively, the pressing device may include the first and second abutting portions, and a biasing device. In this case, the first and second abutting portions are arranged to effect the abutting contact with each other in a direction which is inclined with respect to a plane perpendicular to the axes of the first and second fitting portions. The biasing device is arranged bias the above-indicated one of the first and second fitting portions against the other fitting portion, in a direction which is parallel to the axes of the fitting portions and which causes the first and second abutting portions to effect the abutting contact with each other. In either of the two cases indicated above, the second abutting portion functions to force one of the first and second fitting portions against the other in the radial direction so that the two fitting portions are eccentric with respect to each other, with the fitting clearance being zeroed at one circumferential position of the two fitting portions.

Where the first and second abutting portions are arranged to effect the abutting contact with each other in the direction inclined with respect to the plane perpendicular to the axes of the first and second fitting portions, the suction nozzle and the nozzle holder are positioned relative to each other in the axial direction, concurrently with the relative positioning in the radial direction. However, the relative positioning of the suction nozzle and the nozzle holder in the axial may be effected before or after the relative positioning in the radial direction.

(2) A nozzle-mounting device according to the above mode (1), wherein the second abutting portion includes a movable member supported by the nozzle holder such that the movable member is movable relative to the nozzle holder, and the pressing device includes a biasing device which biases the movable member in a direction for abutting contact with the first abutting portion, the nozzle holder being provided with a movable-member supporting device which movably supports the movable member.

For example, the biasing device includes an elastic member disposed between the movable member and the nozzle holder.

In the above mode (2) of the invention, the second abutting portion may be pressed onto the first abutting portion under a biasing action of the biasing device, for example, so that the inner and outer circumferential surfaces of the first and second fitting portions are forced against each other.

(3) A nozzle-mounting device according to the above mode (2), wherein said movable member is a pivotable member pivotable about a pivot axis thereof, and the biasing device includes an elastic member which acts on a portion of the pivotable member spaced from the pivot axis, to apply a pivoting torque to the pivotable member.

(4) A nozzle-mounting device according to any one of the above modes (1)–(3), wherein the first and second abutting portions are arranged to effect the abutting contact with each other on opposite sides of a plane which is parallel to the direction of the abutting contact and which includes the axes of the first and second fitting portions.

The directions of the abutting contact of the first and second abutting portions on the opposite sides of the plane including the axes of the first and second fitting portions are desirably parallel to each other as viewed in a plane perpendicular to the axes of the first and second fitting portions. However, those directions of the abutting contact may not be parallel to each other, but must not pass the axes of the first and second fitting portions. The direction of the abutting contact of the first and second abutting portions in general is determined by an average of the above-indicated two directions of the abutting contact on the opposite sides of the plane including the axes of the fitting portions.

In the above mode (4) of the invention, the abutting contact of the first and second abutting portions on the opposite sides of the plane parallel to the direction of the abutting contact and including the axes of the first and second fitting portions prevents rotation of the first and second fitting portions relative to each other. If the relative angular position of the first and second fitting portions upon fitting engagement therebetween is such that the first and second abutting portions initially contact each other on only one of the opposite sides of the above-indicated plane, an angular moment or torque is applied to one of the first and second fitting portions so that the two fitting portions are rotated relative to each other until the first and second abutting portions eventually contact each other on the opposite sides of the above-indicated plane. Thus, the rotation of the first and second fitting portions relative to each other is eventually prevented by the abutting contact of the first and second abutting portions on the opposite sides of the above-indicated plane. Where the second abutting portion is a substantially rigid member, in particular, a predetermined angular position of the first and second fitting portions relative to each other is established by the abutting contact of the first and second abutting portions, so that a predetermined relative angular position of the suction nozzle and the nozzle holder is established by the abutting contact of the two abutting portions.

The abutting contact of the first and second abutting portions causes the first and second fitting portions to effect the fitting engagement with their inner and outer circumferential surfaces being forced against each other at one circumferential position, along a generating line of the circumferential surfaces, which generating line lies on the above-indicated plane. Namely, the abutting contact takes plane on the opposite sides of the generating line as viewed in the circumferential direction of the fitting portions. The second abutting portion not only functions, as described before, to zero the fitting clearance at the above-indicated one circumferential position, for thereby causing eccentricity of the two fitting portions, but also functions to prevent the rotation of the two fitting portions relative to each other.

(5) A nozzle-mounting device according to any one of the above modes (1)–(4), wherein the first and second abutting portions are arranged to effect the abutting contact with each other in a direction which is inclined with respect to a plane perpendicular to the axes of the first and second fitting portions, such that the abutting contact causes an axial force to be generated for forcing the suction nozzle and the nozzle holder toward each other in an axial direction thereof.

In the above mode (5) of the invention, the abutting contact of the first and second abutting portions causes one of the first and second fitting portions against the other in the radial direction, and generates the axial force to be applied to the above-indicted one fitting portion, for thereby forcing the suction nozzle and the nozzle holder toward each other in the axial direction. This axial force prevents the removal of the suction nozzle from the nozzle holder. Where the second abutting portion includes a movable member, however, the suction nozzle is permitted to be removed from the nozzle holder by application of a sufficiently large force to the suction force in a direction away from the nozzle holder, since the movable member is moved against a biasing force of the biasing device away from the first abutting portion. Therefore, the suction nozzle can be removed from the nozzle holder, when needed.

Thus, the first and second abutting portions arranged to effect the abutting contact with each other in the direction inclined with the plane perpendicular to the axes of the first and second fitting portions serve as a nozzle-holding device for holding the suction nozzle on the nozzle holder. This nozzle-holding device arranged to force the suction nozzle and the nozzle holder toward each other in the axial direction is effective to reduce the deterioration of the elastic member of the biasing device used in the pressing device, as described above with respect to the above form (1) of the invention, as compared with a conventional nozzle-holding device using only sheet springs. Accordingly, the expected service life of the present nozzle-mounting device can be prolonged.

(6) A nozzle-mounting device according to any one of the above modes (2)–(5), wherein the pressing device includes a stop operable to define a maximum amount of movement of the movable member of the second abutting portion in a direction toward the first abutting portion.

When the movable member of the second abutting portion has been fully moved to a position defined by the stop, for abutting contact with the first abutting portion, not only a further movement of the movable member toward the first abutting portion, but also a movement of the movable member in a direction away from the first abutting portion are inhibited, unless a force larger than the biasing force of the biasing device is applied to the movable member in the direction away from the first abutting portion. Therefore, the movable member placed in the position defined by the stop functions as if it were a stationary member.

(7) A nozzle-mounting device according to any one of the above modes (2)–(7), wherein a second biasing device which biases the suction nozzle and the nozzle holder in the axial direction away from each other is provided in addition to the biasing device of the pressing device provided as a first biasing device.

When a biasing force larger than the biasing force of the second biasing device is applied to the suction nozzle in a direction opposite to the direction of the biasing force of the second biasing device, the suction nozzle is moved toward the nozzle holder, with elastic deformation of the second biasing device. This elastic deformation is effective to alleviate a shock to be generated upon abutting contact of the suction nozzle with the electric component, or upon abutting contact of the electric component held by the suction nozzle with a printed-wiring board when the electric component is mounted on the printed-wiring board. The second biasing device not only functions to permit the suction nozzle and the nozzle holder to be moved relative to each other in the axial direction, but also has a cushioning function for reducing the shock indicated above. The second biasing device may cooperate with other elements to perform another function, as described below with respect to the following mode (8) of this invention, for illustrative purpose only.

(8) A nozzle-mounting device according to the above mode (5), wherein the pressing device includes:

a movable-member supporting device which supports a movable member of the second abutting portion such that the movable member is movable in the direction intersecting the axes of the first and second fitting portions;

a first biasing device which biases the movable member in a direction for abutting contact with the first abutting portion;

a stop operable to define a maximum amount of movement of the movable member by a biasing force of the first biasing device in a direction toward the first abutting portion; and a second biasing device which biases the suction nozzle and the nozzle holder in the axial direction away from each other, and wherein the abutting contact of the movable member of the second abutting portion and the first abutting portion with each other in the direction inclined with respect to the plane generates an axial force which acts on the suction nozzle in the axial direction toward the nozzle holder.

While the movable member is placed in the fully moved position defined by the stop, the first biasing device biasing the movable member does not function to force the first and second fitting portions against each other through the movable member. On the other hand, the second biasing device biases the suction nozzle and the nozzle holder in the axial direction away from each other, so that the movable member in abutting contact with the first abutting portion. Since the direction of this abutting contact is inclined with respect to the plane perpendicular to the axes of the fitting portions, the abutting contact causes the first and second fitting portions to be forced against each other in the radial direction, owing to the inclination of the direction of the abutting contact. As a result, the predetermined relative position of the suction nozzle and the nozzle holder relative to each other in the radial direction is established by the abutting contact, as described above. At the same time, the abutting contact of the movable member and the first abutting portion with each other prevents the movement of the suction nozzle and the nozzle holder in the axial direction away from each other, so that the predetermined position of the suction nozzle and the nozzle holder relative to each other in the axial direction is also established. In the nozzle-mounting device according to the present mode (8) has the feature according to the above feature (4), the predetermined angular position of the suction nozzle and the nozzle holder relative to each other is also established.

(9) A nozzle-mounting device according to any one of the above modes (1)–(8), wherein the suction nozzle includes the first fitting portion having the inner circumferential surface, while the nozzle holder includes the second fitting portion having the outer circumferential surface.

(10) A nozzle-mounting device according to the above mode (9), wherein the first fitting portion of the suction nozzle is provided with two first abutting portions located on opposite sides of a plane which is parallel to the direction of the abutting contact and which includes the axis of the first fitting portion, while the second fitting portion is provided with two second abutting portions for abutting contact with the two first abutting portions.

The direction of the abutting contact has been discussed above with respect to the above form (4).

In the above mode (10) of this invention, rotation of the suction nozzle relative to the nozzle holder is prevented by the abutting contact of the two first abutting portions with the respective two second abutting portions.

(11) A nozzle-mounting device according to the above mode (10), wherein the two first abutting portions consist of two projecting pins which extend from an outer circumferential surface of the first fitting portion in opposite directions such that the two projecting pins are coaxial with each other.

The two projecting pins are disposed so as to lie on a plane perpendicular to the axis of the first fitting portion. The two projecting pins may be two separate pins. Alternatively opposite end portions of a single pin may function as the two projecting pins.

(12) A nozzle-mounting device according to any one of the above modes (1)–(8), wherein the suction nozzle includes the second fitting portion having the outer circumferential surface, while the nozzle holder includes the first fitting portion having the inner circumferential surface.

(13) A nozzle-mounting device according to the above mode (12), wherein the first abutting portion provided on the second fitting portion of the suction nozzle is formed on the outer circumferential surface so as to extend in a direction which is inclined with respect to a plane perpendicular to the axis of the second fitting portion, such that the abutting contact of the first abutting portion with the second abutting portion generates an axial force which acts on the suction nozzle in an axial direction toward the nozzle holder, and the first fitting portion of the nozzle holder has an opening which permits the second abutting portion to be brought into abutting contact with the first abutting portion.

The second abutting portion is arranged to be brought into abutting contact with the first abutting portion, while extending through the opening formed through the first fitting portion. Owing to the inclination of the first abutting portion with respect to the plane perpendicular to the axis of the second fitting portion, the abutting contact of the second abutting portion with the first abutting portion generates the axial force for forcing the first and second fitting portions against each other in the axial direction, to there by force the suction nozzle and the nozzle holder toward each other in the axial direction.

(14) A nozzle-mounting device according to the above mode (13), wherein the first abutting portion is a side surface of a cutout formed in the outer circumferential surface of the second fitting portion.

(15) A nozzle-mounting device according to the above mode (10) or (13), wherein the second abutting portion includes at least one roller rotatable about an axis perpendicular to the axes of the first and second fitting portions.

The at least one roller of the second abutting portion rolls on the first abutting portion when each roller comes into abutting contact with the first abutting portion or moves apart from the first abutting portion. Thus, the abutting contact of the first and second abutting portions with each other takes place with a rolling friction rather than a sliding friction, permitting a smooth operation of the first and second abutting portions and a reduced amount of wear of these abutting portions.

(16) A nozzle-mounting device according to any one of the above modes (1))-(15), wherein a low-friction coating having a lower friction coefficient than the first and second fitting portions is formed on at least one of the inner and outer circumferential surfaces of the first and second fitting portions.

In the above mode (16) of this invention, the first and second fitting portions can smoothly slide on each other, facilitating relative rotation and axial movement of the two fitting portions. Where the second biasing device biasing the suction nozzle and the nozzle holder in the axial direction away from each other as described above with respect to the above mode (7), for instance, the cushioning function of the second biasing device is effectively performed to prevent damaging of the electric component and/or damaging or bending of the suction nozzle upon sucking of the electric component by the suction nozzle. Where the first and second abutting portions are arranged to effect the abutting contact with each other on the opposite sides of the plane parallel to the direction of the abutting contact and including the axes of the fitting portions, as described above with respect to the above mode (4), for example, the abutting contact of the first and second abutting portions causes smooth rotation of the first and second fitting portions relative to each other, so as to establish the predetermined relative angular position therebetween.

The low-friction coating may be formed on both of the inner and outer circumferential surfaces, or only one of these circumferential surfaces. Where the low-friction coating is provided on only one of the two circumferential surfaces, the low-friction coating is preferably provided on the circumferential surface of the fitting portion of the suction nozzle. In this case, the circumferential surface of the fitting portion of the nozzle holder is preferably hardened, annealed and ground. In this respect, it is noted that the same nozzle holder is used for a plurality of suction nozzles each of which is repeatedly mounted on and removed from the nozzle holder, so that the nozzle holder is required to have a high degree of durability.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 3 is a front elevational view partly in cross section showing the component-mounting unit of FIG. 2;

DETAILED DESCRIPTION OF THE PREFERRED EMBODIMENTS

Figure 1:
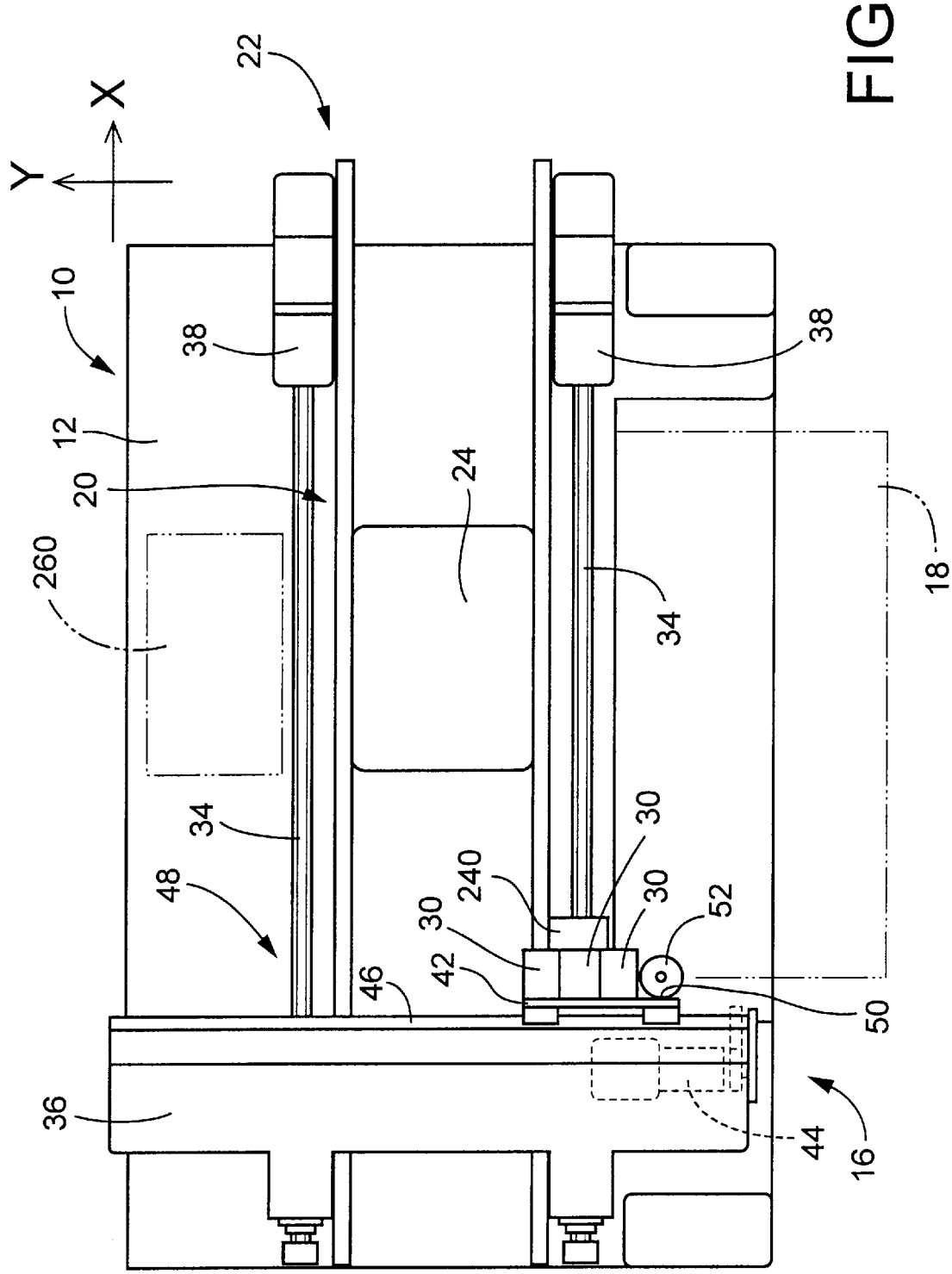
FIG. 1 is a plan view of an electric-component mounting system including an electric-component mounting device provided with a nozzle-mounting device constructed according to one embodiment of the present invention.

Referring to First to FIG. 1, reference numeral 10 denotes a machine base of an electric-component mounting system 12, which is an example of an electric-component handling system. The electric-component mounting system 12 includes an electric-component mounting device 16, an electric-component supply device 18 and a printed-wiring-board supporting and transferring device 20 (hereinafter abbreviated as "PWB transferring device 20"), which devices 16, 18 and 20 are mounted on the machine base 10.

The PWB transferring device 20 includes a printed-wiring-board conveyor 22 (hereinafter abbreviated as "PWB conveyor 22") extending in an X-axis direction (in the horizontal direction as seen in FIG. 1), and a printed-wiring-board support device (not shown) and a printed-wiring-board clamping device (not shown), which are disposed within a longitudinal dimension of the PWB conveyor 22. A printed-wiring substrate in the form of a printed-wiring board 24 is transferred and positioned at a predetermined component-mounting position by the PWB conveyor 22, and is supported by the printed-wiring-board support device. In the present electric-component mounting system 10, the printed-wiring board 24 is supported such that a surface of the board 24 on which electric components (such as electronic components) are to be mounted is parallel to the horizontal plane. On one side of the PWB conveyor 22, there is fixedly disposed the electric-component supply device 18. No further description of this electric-component supply device 18 is deemed necessary, since this device 18 does not directly relate to the present invention.

Figure 2:
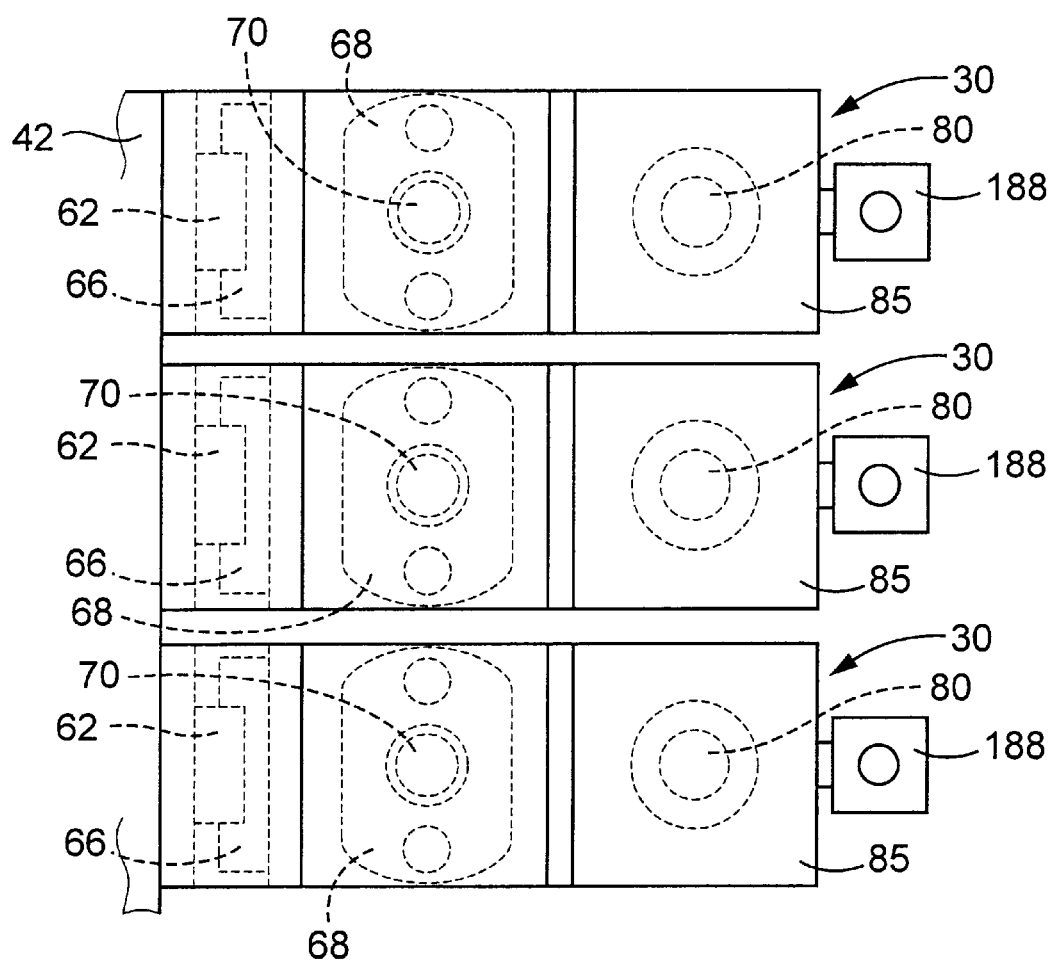
FIG. 2 is a plan view of a component-mounting unit which is an element of the electric-component mounting device.

The electric-component mounting device 16 will be described first. As shown in FIGS. 2 and 3, this electric-component mounting device 16 includes a plurality of component-mounting units 30, three units 30, in this embodiment. Each of the component-mounting units 30 is movable in the above-indicated X-axis direction and a Y-axis direction which are perpendicular toe each other. In operation, the component-mounting unit 30 is linearly moved in a direction having an X-axis component and a Y-axis component, for transferring an electric component 32 (which is typically an electronic component) to an appropriate position in the XY coordinate system, and mounting the electric component 32 on the surface of the printed-wiring board 24. For movements of the component-mounting unit 30, the machine base 10 is provided with two ballscrews 34 disposed on respective opposite sides of the PWB conveyor 22 such that the two ballscrews 34 extend in the X-axis direction and are spaced apart from each other in the Y-axis direction, as shown in FIG. 1. The ballscrews 34 are held in engagement with respective nuts (not shown) fixed to an X-axis slide 36, and are rotated by respective X-axis drive motors 38 shown in FIG. 1, so that the X-axis slide 36 is moved in the X-axis direction. The machine base 10 is further provided with a pair of guide members in the form of guide rails (not shown) disposed below the respective two ballscrews 34, and the X-axis slide 36 has guide blocks (not shown) slidably engaging the respective guide rails, so that the X-axis slide 36 is moved in the X-axis direction while being slidably guided by the guide rails.

The X-axis slide 3 is provided with a ballscrew (not shown) extending in the Y-axis direction, and an Y-axis slide 42 is mounted o the X-axis slide 36 such that a ballnut fixed to the Y-axis slide 42 is held in engagement with the ballscrew. The Y-axis slide 42 is moved in the Y-axis direction while being guided by a pair of guide members in the form of guide rails 46, with the ballscrew being rotated by an Y-axis drive motor 44 shown in FIG. 1. An XY robot 48 is principally constituted by the X-axis slide 36, X-axis drive nut, X-axis drive ballscrew 34, X-axis drive motor 38, Y-axis slide 42, Y-axis drive nut and ballscrew and Y-axis drive motor 44.

The Y-axis slide 42 has a vertically extending side surface 50 on which are mounted the three component-mounting units 30 and an image-taking device 52. The image-taking device 52 has a CCD camera which faces downwards and which is provided to take a fiducial mark provided on the printed-wiring board 24. All of the three component-mounting units 30 have the same construction. One of these units 30 will be described. As shown in FIG. 3, each component-mounting unit 30 includes a component-mounting head 54, a vertical drive device 56 for vertically moving the component-mounting head 54, and a rotary drive device 58 for rotating the component-mounting head 54 about its axis of rotation.

The vertical drive device 56 has a drive power in the form of a vertical-drive motor 60. The Y-axis slide 42 has guide members in the form of guide rails 62 which extend in a direction perpendicular to the surface of the printed-wiring board 24, that is, in the vertical direction. On the guide rails 62, there is slidably mounted a Z-axis slide 64 such that the Z-axis slide 64 is slidable at its guide block 66 on the guide rails 62 in the vertical or Z-axis direction. A nut 68 is fixed to the Z-axis slide 64 such that the nut 68 extends in the vertical direction. The nut 68 is held in engagement with a feedscrew 70 which is disposed on the Y-axis slide 42 such that the feedscrew 70 is rotatable but is not axially movable relative to the Y-axis slide 42. With the feedscrew 70 being rotated by the vertical-drive motor 60, the Z-axis slide 64 is moved in the vertical direction. In the present embodiment, the vertical-drive motor 60 is a servomotor the operating angle of which can be controlled with high accuracy, so that the Z-axis slide 64 can be moved to a desired position in the Z-axis direction. The operating angle of the vertical-drive motor 60 is detected by an encoder 72, and the vertical position of the Z-axis slide 64 is controlled on the basis of the output signal of the encoder 72.

On the Z-axis slide 64, there is disposed a rotary shaft 80 through bearings 82 such that the rotary shaft 80 is rotatable about a vertical axis but is not axially movable relative to the Z-axis slide 64. The rotary shaft 80 is rotated by a rotary-drive motor 84 which is disposed on the Z-axis slide 64 such that its axis of rotation extends in the Z-axis direction. In the present embodiment, the rotary-drive motor 84 is a servomotor, so that the rotary shaft 80 can be rotated to a desired angular position. The operating angle of the rotary-drive motor 84 is detected by an encoder 85, and the angular position of the rotary shaft 80 is controlled on the basis of the output signal of the encoder 85. The rotary shaft 80 is provided with a sensed member 86 which is detected by a reference-position switch 88. The sensed member 86 is provided to detect a reference angular position of the rotary shaft 80. In the present embodiment, the reference-position switch 88 is a photoelectric switch of light transmission type.

The rotary shaft 80 has a circular shape in transverse cross section, and carries the component-mounting head 54 at its free end portion which projects downwards from the Z-axis slide 64. In the present embodiment, the component-mounting head 54 has a suction nozzle 100 and a nozzle holder 102. The nozzle holder 102 includes a holder body 106 has a circular shape in transverse cross section, having a constant diameter. The holder body 106 is formed integrally and coaxially with the rotary shaft 80. The nozzle holder 102 includes a second fitting portion 110 having a straight outer circumferential surface 108 which has a constant diameter and which is hardened, annealed and then ground.

Figure 5:
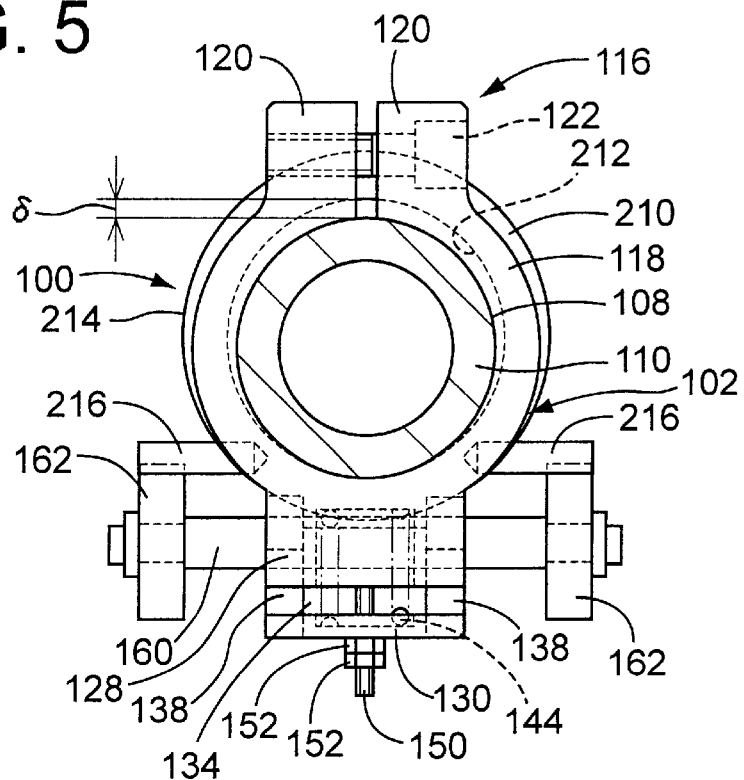
FIG. 5 is a plan view showing in cross section a part of the component-mounting head, at which a bracket of a nozzle holder is fixed.

The holder body 106 is provided with a bracket 116 fixed thereto. As shown in FIG. 5, the bracket 116 has a generally C-shaped fixing portion 118 which is fitted on an upper portion of the straight outer circumferential surface 108. The fixing portion 118 has two lug portions 120 which extend from the respective circumferentially opposite ends of its C-shaped part, in the radial outward direction. The two lug portions 120 are tightened together by a screw member 122, so as to reduce the diameter of the C-shaped part of the fixing portion 118, so that the bracket 116 is fixedly mounted on the upper part of the second fitting portion 110. The bracket 116 fixed to the second fitting portion 110 cooperates with the holder body 106 to constitute the nozzle holder 102.

Figure 4:
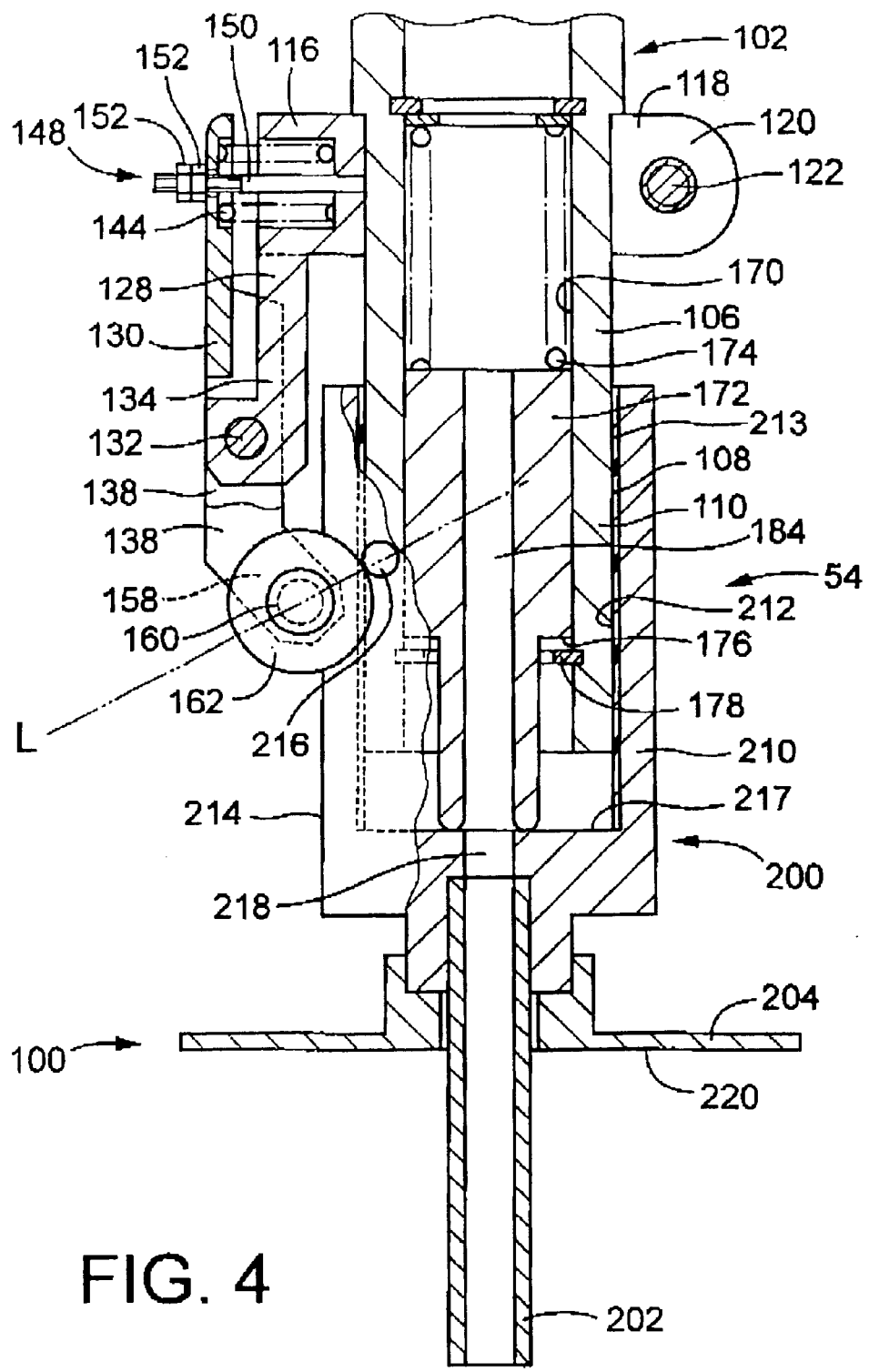
FIG. 4 is a front elevational view partly in cross section showing a component-mounting head of the component-mounting unit.

As shown in FIGS. 4 and 5, the bracket 116 is provided with a support portion 128 which is located opposite to the pair of lug portions 120 of the fixing portion 118 in the diametric direction of the nozzle holder 102. The support portion 128 includes a radial portion extending radially outwardly of the holder body 106, and a downward extension extending downwards from the radial portion in the axial direction of the holder body 106, down to an axially intermediate part of the second fitting portion 110. A pivotable member as a movable member in the form of a lever 130 is attached to the free end of the downward extension of the support portion 128 such that the lever 130 is pivotable. The lever 130, which also functions as an abutting member, is a rigid member. The lever 130 is disposed on the support portion 128 such that the lever 130 is movable in a direction intersecting the axis of the second fitting portion 110. In the present embodiment, the bracket 116, and the portion of the holder body 106 at which the bracket 116 is attached, cooperate to constitute a movable-member supporting device for movably supporting the movable member in the form of the lever 130.

The support portion 128 has a smaller width at its lower portion than at its upper end portion, namely, has a narrow section 134 which carries a support shaft 132 fixed to its lower end portion by press-fitting or other suitable fixing means. The lever 130 is a generally elongate member, and consists of an upper portion and a pair of lower arm portions 138, as shown in FIGS. 4 and 5. The above-indicated narrow section 134 of the support portion 128 is interposed between the lower arm portions 138 of the lever 130, and the opposite end portions of the support shaft 132 which extend from the narrow section 134 are held in engagement with respective holes formed in longitudinally intermediate parts of the arm portions 138 such that the support shaft 132 is rotatable relative to the arm portions 138. Thus, the lever 130 is supported by the support shaft 132 such that the lever 130 is pivotable about a horizontally extending axis of rotation (i.e., the axis of the support shaft 132) which is perpendicular to the axis of rotation of the holder body 106. Further, the lever 130 is pivotally supported by the bracket 116 with a high degree of rigidity, at two positions which is spaced apart from each other in the axial direction of the support shaft 132.

An elastic member as a biasing device in the form of a compression coil spring 144 (hereinafter referred to as "spring 144") is interposed between the longitudinally upper end of the lever 130 and the bracket 116, for biasing the lever 130 in a direction that causes the lower end portion to move toward the second fitting portion 110 of the holder body 106, for abutting contact with a first abutting portion 216 which will be described. The spring 144 acts on the lever 130, at a position spaced from the pivoting axis, so as to apply a pivoting torque to the lever 130. In this embodiment, the spring 144 serves as a first biasing device for biasing the lever 130.

A maximum angle of pivoting of the lever 130 by the spring 144 is determined by a position of a stop 148 provided on the bracket 116. Described in detail, the bracket 116 has a threaded member 150 which extends in the radial direction of the second fitting portion 110, through the upper end portion of the lever 130 such that the threaded member 150 is axially movable relative to the lever 130. Two nuts 152 are screwed on the free end portion of the threaded member 150. The maximum angle of pivoting of the lever 130 by the spring 144 is determined by abutting contact of the upper end portion of the lever 130 with the nuts 152. By changing the position of the nuts 152 on the threaded member 150, the maximum pivoting angle of the lever 130 can be adjusted as desired. In the present embodiment, the threaded member 150 and the two nuts 152 cooperate to constitute the stop 148 which permits a change of the maximum angle of pivoting of the lever 130 by the spring 144.

The pair of arm portions 138 include respective lower bent-end sections 158 which extend downwards from the support shaft 132 and which are bent such that the extreme lower ends of the bent-end sections 158 approach the axis of the second fitting portion 110, as indicated in FIG. 4. These lower bent-end sections 158 are located between the upper and lower ends of the second fitting portion 110 as seen in the axial direction of the second fitting portion 110, as shown in FIG. 4. A support shaft 160 is provided so as to extend through the lower bent-end sections 158 of the two arm portion 138, in parallel with the pivot axis of the lever 130, as indicated in FIG. 5.

The two arms 138 are spaced apart from each other in a horizontal direction parallel to a diametric direction of the second fitting portion 110. The support shaft 160 extends in parallel with this horizontal direction. The support shaft 160 carries two rollers 162 at its opposite ends spaced from the respective arms 138, such that the rollers 162 rotatable about an axis of the support shaft 160. These rollers 162 serve as an operating portion or an end portion of the lever 130, which is provided for abutting contact with the first abutting portion 216 (which will be described). In the present embodiment, the two rollers 162 are considered to constitute a part of the movable member or pivotable member in the form of the lever 130, and function a second abutting portion for abutting contact with the first abutting portion 216. The two rollers 162 are rotatable about a common axis which is parallel to the diametric direction of the second fitting portion 110 and which lies on a horizontal plane perpendicular to the axis of the second fitting portion 110. The two rollers 162 are located on the respective opposite sides of a vertical plane which is parallel to the pivoting direction of the lever 130 and which includes the axis of the second fitting portion 110. The two rollers 162 are spaced from the above-indicated vertical plane by the same distance in the axial direction of the support shaft 160. The pivoting direction of the lever 130 indicated above is a direction (indicated by two-dot chain line L in FIG. 4) in which the rollers 162 are brought into abutting contact with the first abutting portion in the form of projecting pins 216 which will be described. In the present embodiment, the rollers 162 are ball bearings provided with dust seals for preventing entry of dust and dirt and leakage of a lubricant oil.

The holder body 106 has a constant-diameter hole 170 having a circular shape in transverse cross section. A cylindrical connecting member 172 is fitted in the hole 170 such that the connecting member 172 is axially movable relative to the holder body 106. The connecting member 172 is biased by an elastic member in the form of a compression coil spring 174 (hereinafter referred to as "spring 174") in the downward direction. The biasing force of this spring 174 is determined to be smaller than that of the spring 144. The connecting member 172 is a stepped cylindrical member including an upper large-diameter portion and a lower small-diameter portion having a smaller diameter than the large-diameter portion, and further including a shoulder surface 176 between the large-diameter and small-diameter portions. The fully lowered or lowermost position of the connecting member 172 biased by the spring 174 is determined by an abutting contact of the shoulder surface 176 with a stop 178 which is a stop ring fixedly fitted in the inner circumferential surface of the hole 170. When the connecting member 172 is placed in its fully lowered position with its shoulder surface 176 held in abutting contact with the stop 178, the lower end of the lower small-diameter portion of the connecting member 172 is located below the lower end of the holder body 106 (second fitting portion 110). In this embodiment, the connecting member 172 and the spring 174 cooperate to constitute a second biasing device for biasing the suction nozzle 100 and the nozzle holder 102 away from each other.

The connecting member 172 has a passage 184 formed in the axial direction through a radially central part thereof. This passage 184 is connected to a negative-pressure source and a positive-pressure source through the hole 170 formed through the holder body 106, a passage 186 formed through the rotary shaft 80 as shown in FIG. 3, and a coupling device 188 also shown in FIG. 3. The coupling device 188 is arranged to maintain a negative pressure within the passage 186 even during rotation of the rotary shaft 80. It is noted that while a small clearance is left between the outer circumferential surface of the connecting member 172 and the inner circumferential surface of the hole 170, to permit fitting engagement of the connecting member 172 within the hole 170, this fitting engagement is pressure-tight engagement that does not practically cause a problem. The coupling device 188 is connected to a suitable switching device for selective communication of the passage 186 to the negative-pressure source or the positive-pressure source, or disconnection from both of these sources.

The suction nozzle 100 will then be discussed. In the present embodiment, the suction nozzle 100 has a nozzle body 200, a suction tube 200 and a light-emitting body in the form of a light-emitting plate 204, as shown in FIG. 4. The nozzle body 200 is a cylindrical member having a cylindrical portion 210 which is closed and open at the respective opposite ends. This cylindrical portion 210 serves as a first fitting portion having a straight inner circumferential surface 212 which has a constant diameter. In the present embodiment, the straight inner circumferential surface 212 is covered with a low-friction coating 213 formed of polytetrafluoroethylene, which is an example of a low-friction material having a low friction coefficient. It is noted that the thickness of the low-friction coating 213 is exaggeratedly shown in FIG. 4 so as to be considerably larger than it is, for easier understanding.

As shown in FIGS. 4 and 5, two projecting pins 216 are fixedly disposed on an outer circumferential surface 214, at respective positions slightly above the axially intermediate position of the first fitting portion 210. The two projecting pins 216, which have a circular shape in transverse cross section, are fixed by brazing or any other suitable fixing means to the outer circumferential surface 214 such that the pins 216 in respective opposite directions parallel to the axis of the support shaft 160, as shown in FIG. 5. The two projecting pins 216 lie on a horizontal plane perpendicular to the axis of the first fitting portion 210, and are located at the respective positions corresponding to the respective two rollers 162, on the respective opposite sides of a vertical plane which includes the axis of the first fitting portion 210 and which is parallel to the direction in which the rollers 162 are brought into abutting contact with the pins 216. The projecting pins 216 constitute the first abutting portion for abutting contact with the second portion in the form of the rollers 162. In the present embodiment wherein the two pins 216 lie on the same plane and are coaxial with each other, the directions of abutting contact of the two rollers 162 with the respective pins 216 are parallel to the direction of pivoting of the lever 130 and are parallel to each other, as viewed in the plane of FIG. 5, and the points of contact of the two rollers 162 with the pins 216 lie on the same horizontal plane perpendicular to the axis of the first and second fitting portions 210, 110.

In the present embodiment, the two projecting pins 216 are positioned in a radial direction of the first fitting portion 210 which is perpendicular to the common axis of the pins 216, such that a straight line connecting the generating lines of the circumferential surfaces of the two pins 216 which are most distant from the axis of the first fitting portion 210 in the above-indicated radial direction lie on a vertical plane (parallel to the axis of the first fitting portion 210) which is tangent to the straight inner circumferential surface 212 at a point nearest to the axis of the support shaft 160 in the above-indicated radial direction (as seen in the plane of FIG. 5). Further, the maximum angle of pivoting of the lever 130 is determined by the stop 148 such that the rollers 162 on the lever 130 can be brought into contact with the pins 216 when the first fitting portion 210 is fitted into the second fitting portion 110. In other words, the fully pivoted position of the lever 130 is determined for engagement of the rollers 162 with the projecting pins 216 during mounting of the suction nozzle 100 on the nozzle holder 102. It is noted that the light-emitting plate 204 of the suction nozzle 100 is not shown in FIG. 5.

The suction tube 202 is fixedly fitted at its upper end portion in the lower end portion of the nozzle body 200 such that the suction tube 202 is coaxial with the nozzle body 200. That is, the nozzle body 200 has a bottom wall having an upper surface 217 and a passage 218 open in the upper surface 217, as shown in FIG. 4. The suction tube 202 is held in communication through the passage 218 with the interior space within the first fitting portion 210. In the present embodiment, the light-emitting plate 204 is a circular disc which has a considerably larger outside diameter than the suction tube 202 and which is fixed mounted on the nozzle body 200 such that the circular disc is coaxial with the nozzle body 200. The suction tube 202 extends through the light-emitting plate 204. The lower surface of the light-emitting plate 204 which is nearer to the lower sucking end of the suction tube 202 is coated with a fluorescent material, to provide a light-emitting surface 220 which absorbs a ultraviolet radiation and emits a visible light.

On the above-described X-axis slide 37, there are mounted an image-taking device 240 and an illuminating device 242, as shown in FIG. 3. These image-taking device 240 and illuminating device 242 are similar in construction to an image-taking device and an illuminating device as disclosed in JP-B2-7-75817. The image-taking device 240 includes a CCD camera and a lens, and is arranged to take a two-dimensional image of the electric component 32 as held by suction by the suction nozzle 100.

In the present embodiment, the illuminating device 242 includes a ring lamp 244 operable to emit a ultraviolet radiation. On one side of the ring lamp 244 on the side of the suction nozzle 100, there are disposed an annular first filter 246 which permits transmission of only the ultraviolet radiation, and a second filter 248 which is opposed to the electric component 32 held by the suction nozzle 100, when the image of the electric component 32 is taken by the image-taking device 240. The second filter 248 absorbs the ultraviolet radiation and transmits the visible light. The ultraviolet radiation emitted by the ring lamp 244 is transmitted through the annular first filter 246, and is incident upon and absorbed by the light-emitting plate 204, while at the same time the visible light is emitted from the light-emitting plate 204 toward the electric component 32, so that the electric component 32 is irradiated with the visible light. A light representative of a projection image or silhouette image of the electric component 32 is incident upon the image-taking device 240 through the second filter 248, so that the projection image is taken by the image-taking device 240. The light-emitting plate 204 may be considered as a part of the illuminating device 242.

As shown in FIG. 1, a nozzle-accommodating device 260 is mounted on the machine base 12. In the present embodiment, the nozzle-accommodating device 260 is similar in construction to a nozzle-accommodating device as disclosed in JP-A-11-220294. Described briefly, the nozzle-accommodating device 260 accommodates different types of suction nozzles 100 which have the same nozzle body 200 and can therefore be mounted on the same nozzle holder 102. The suction tubes 202 of the suction nozzles 100 of the different types have different diameters but have the same length and the same diameter of the light-emitting plate 204. The suction nozzles 100 of the different types whose suction tubes 202 have the respective diameters are used to hold the electric components 32 whose sizes correspond to the diameters of the suction tubes 202.

As partly shown in FIGS. 6–9, the nozzle-accommodating device 260 includes a nozzle holding member 262 in the form of a relatively thick plate. The nozzle holding member 262 has a plurality of nozzle holding holes 264 formed in equally-spaced-apart relation with each other. Each nozzle holding hole 264 is stepped having small-diameter portion 266 and a large-diameter portion 268. The suction nozzle 100 is accommodated in the nozzle holding hole 264 such that the suction tube 202 is fitted in the small-diameter portion 266 while the light-emitting plate 204 is fitted in the large-diameter portion 268, with its lower light-emitting surface 220 in contact with a shoulder surface between the small-diameter and large-diameter portions 266, 268. In this state, the nozzle body 200 projects upwards from the nozzle holding member 262.

The nozzle holding member 262 is covered by a removal-preventive member in the form of a plate 276, which is a relatively thin plate having a plurality of openings 278 formed in parallel with each other. Each opening 278 has a plurality of circular-hole portions 280 and connecting portions 282 connecting adjacent ones of the circular-hole portions 280. The removal-preventive plate 276 has a pair of protrusions defining each of the connecting portions 282. These protrusions function as a removal-preventive portion 284 for preventing the removal of the suction nozzle 100, as described below.

Figure 6:
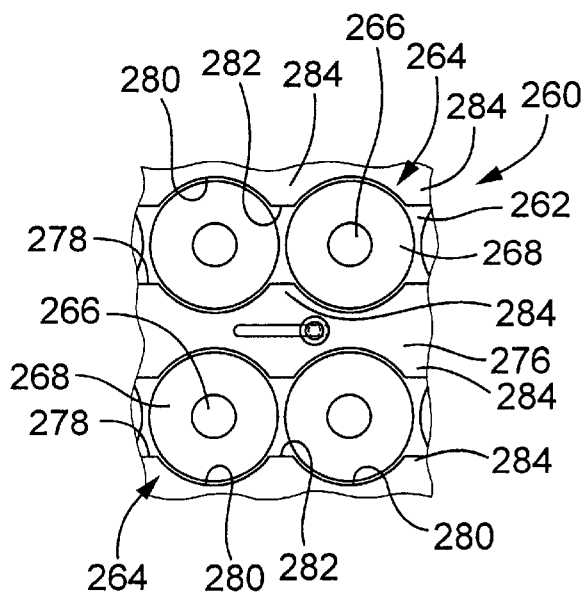
FIG. 6 is a plan view showing a portion of a nozzle-accommodating device which is an element of the electric-component mounting system, in a state in which a suction nozzle can be taken out of the nozzle-accommodating device.
Figure 7:
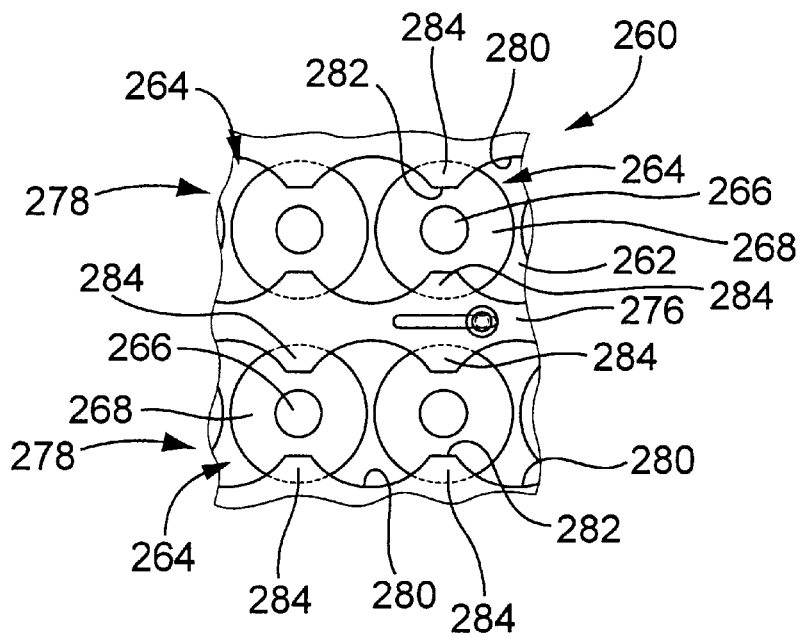
FIG. 7 is a plan view showing a portion of the nozzle-accommodating device in a state in which the suction nozzle cannot be taken out of the nozzle-accommodating device.
Figure 8:
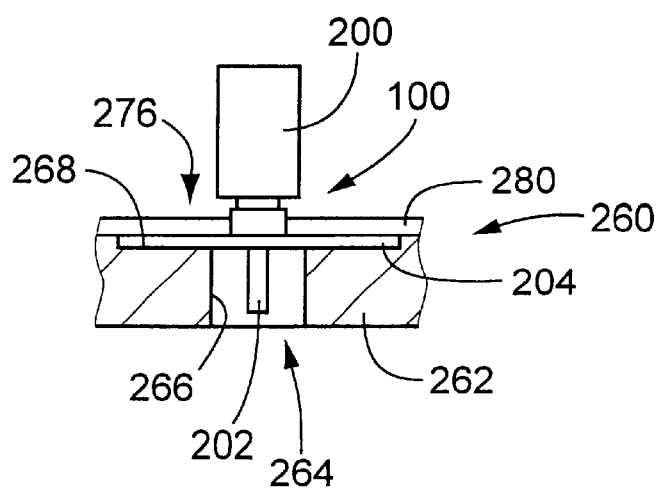
FIG. 8 is a front elevational view in cross section showing a portion of the nozzle-accommodating device.

The removal-preventive plate 276 is movable between a non-operated position of FIG. 6 and an operated position of FIG. 7, by a suitable drive device and a biasing device (not shown). In the operated position of FIG. 7, the removal-preventive portion 284 is located over the nozzle holding holes 264, to prevent the removal of the suction nozzles 100 from the nozzle holding holes 264. In the non-operated position of FIG. 6, the circular-hole portions 280 of the openings 278 are substantially aligned with the nozzle holding holes 264, allowing the removal of the suction nozzles 100 from the nozzle holding member 262.

Figure 9:
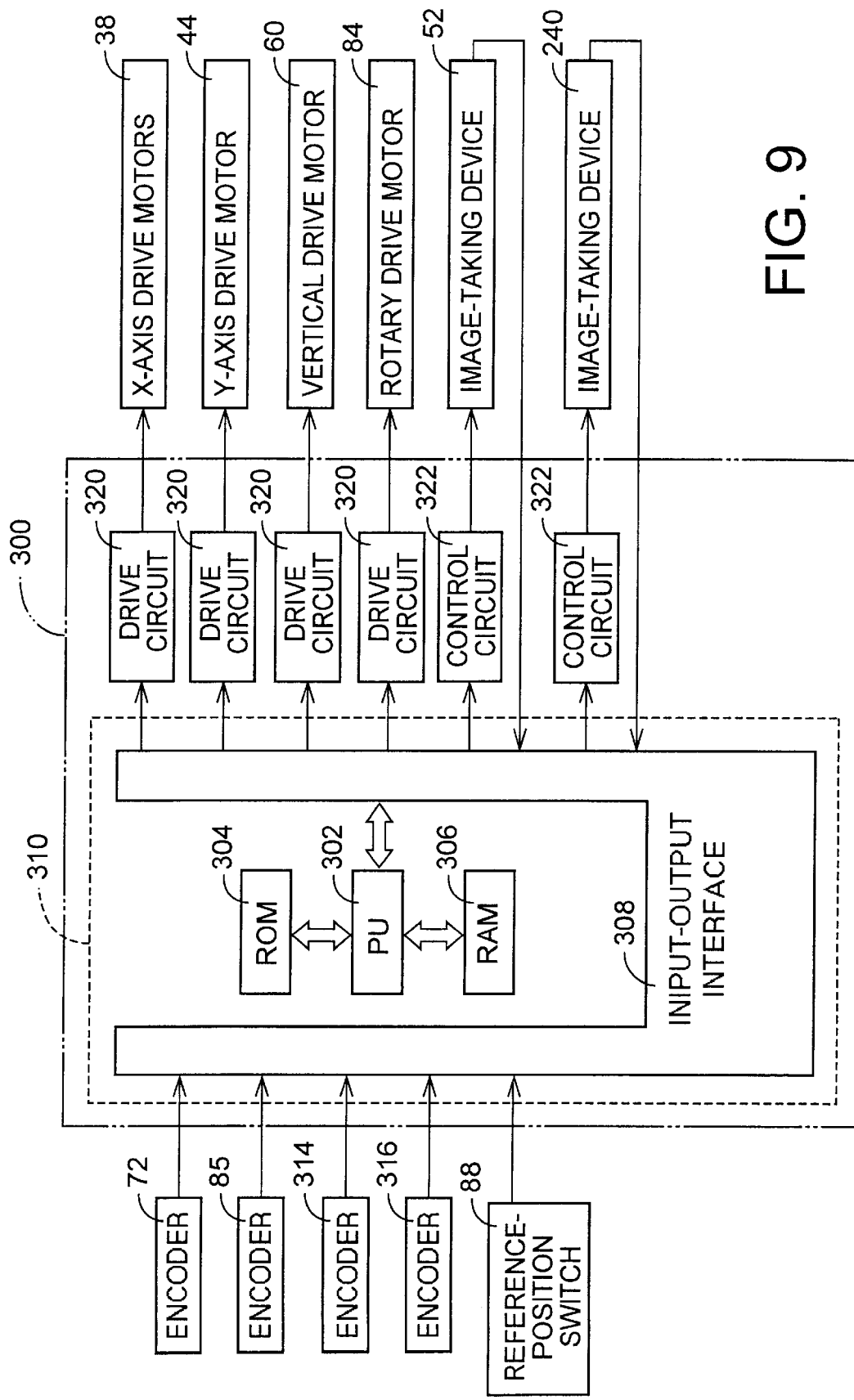
FIG. 9 is a block diagram illustrating a portion of a control device for the electric-component mounting system, which portion relates to the present invention.

The present electric-component mounting system 12 uses a control device 300 shown in FIG. 9. The control device 300 is principally constituted by a computer 310 incorporating a processing unit (PU) 302, a read-only memory (ROM) 304, a random-access memory (RAM) 306, and an input-output interface 308. To the input-output interface 308, there are connected the encoders 72, 85, 314, 316 and the CCD cameras of the image-taking devices 52, 240. The encoders 314, 316 are provided to detect the operating angles of the X-axis drive motor 38 and the Y-axis drive motor 44, respectively. The encoders 72, 85, 314, 316 function as a device for detecting the amounts of operation of the drive motors 60, 84, 38, 44.

To the input-output interface 308, there are also connected the various actuators such as the X-axis drive motor 38, through respective driver circuits 320. The CCD cameras of the image-taking devices 52, 240 are connected to the input-output interface 308 through respective control circuits 322. In the present embodiment, the drive motors such as the X-axis drive motor 38 are servomotors. However, these drive motors may be stepping motors. The ROM 304 stores various control programs such as component-mounting control programs for mounting the electric components 32 on the printed-wiring board 24.

In the electric-component mounting system 10 constructed as described above, the electric components 32 are mounted or placed on the printed-wiring board 24, by the three component-mounting units 30. When the type or kind of the electric components 32 is changed from one to another, the kind of the suction nozzle 100 is accordingly changed. Upon changing of the suction nozzle 100 for a given one of the component-mounting units 30, the component-mounting unit 30 in question is moved to the position of the nozzle-accommodating device 260. In this position, the suction nozzle 100 presently mounted on the nozzle holder 102 is removed from the nozzle holder 102 and is returned to the nozzle-accommodating device 260, and the suction nozzle 100 to be used for the subsequent component-mounting operation is taken out of the nozzle-accommodating device 260 and is mounted on the nozzle holder 102. In the present embodiment, the removal and mounting of the suction nozzles 100 from and onto the nozzle holder 102 are effected in an automatic fashion by vertical movements of the nozzle holder 102 and the nozzle holding member 262, and movements of the removal-preventive plate 276 and other related devices. The vertical movements of the nozzle holder 102 to remove and mount the suction nozzles 100 are effected in a manner similar to that as disclosed in JP-A-11-220294, and will be described only briefly since the vertical movements of the nozzle holder 102 do not directly relate to the present invention. There will be described in detail the manners of removing and mounting the suction nozzles 100 from and onto the nozzle holder 102.

Figure 10:
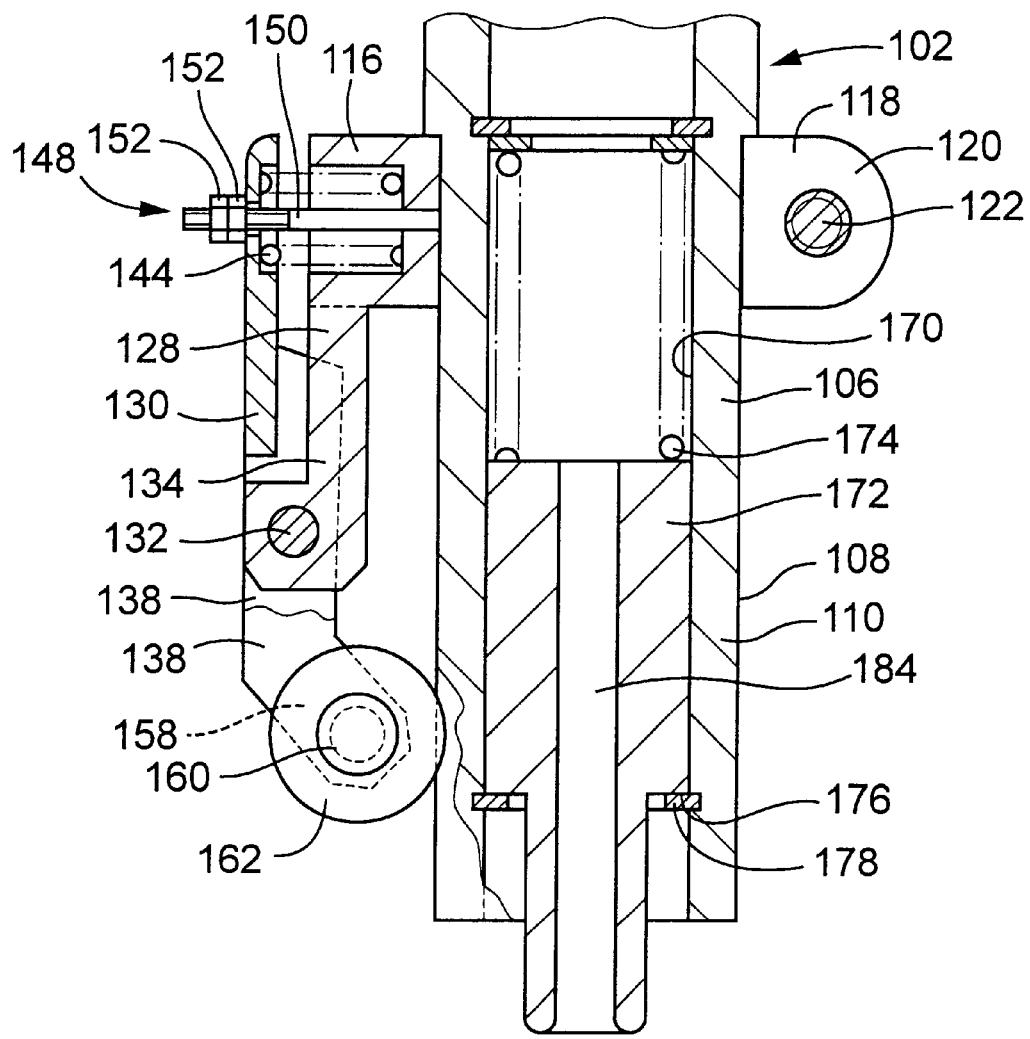
FIG. 10 is a front elevational view partly in cross section showing the component-mounting head with the suction nozzle removed from the nozzle holder.

There will be first described the case where the suction nozzle 100 is mounted on the nozzle holder 102 while no suction nozzle is presently mounted on the nozzle holder 102. When no suction nozzle 100 is mounted on the nozzle holder 102, the lever 130 is placed in its fully pivoted position defined by the stop 148, while the connecting member 172 is placed in its fully lowered position defined by the stop 178, as shown in FIG. 10. In this state, the nozzle holder 102 is moved to a position right above the suction nozzle 100 to be used next, which suction nozzle 100 is accommodated in the nozzle-accommodating device 260. The nozzle holder 102 is then lowered. At this time, the nozzle holder 102 is placed in a predetermined nozzle-mounting angular position for mounting the suction nozzle 100. In the nozzle-accommodating device 260, the removal-preventive plate 276 is placed in its operated position preventing the removal of the suction nozzles 100, and the suction nozzles 100 are placed in a predetermined nozzle-removal angular position in which they were removed from the nozzle holder 102 and accommodated in the nozzle-accommodating device 260. In the present embodiment, this nozzle-removal angular position is stored in the RAM 306 of the computer 310, as an angular position with respect to the reference angular position detected by the reference-position switch 88. When the suction nozzle 100 is mounted on the nozzle holder 102, the nozzle holder 102 is brought into the predetermined nozzle-mounting angular position corresponding to the nozzle-removal angular position of the suction nozzle 100 to be mounted onto the nozzle holder 102, so that the angular position of the two rollers 162 about the axis of the nozzle holder 102 is substantially aligned with that of the two projecting pins 216 about the suction nozzle 100, whereby the suction nozzle 100 can be mounted on the nozzle holder 102 by the vertical movements of the nozzle holder 102.

As the nozzle holder 102 is lowered, its second fitting portion 110 is fitted into the first fitting portion 210 of the nozzle body 200 of the suction nozzle 100, with sliding engagement of the straight outer circumferential surface 108 of the second fitting portion 110 with the straight inner circumferential surface 212 of the first fitting portion 210. After the rollers 162 attached to the lever 130 have been brought into contact with the projecting pins 216, the lever 130 is pivoted from its fully pivoted position against the biasing force of the spring 144 in a direction away from the projecting pins 216, permitting the fitting engagement between the first and second fitting portions 110, 210. During this pivotal movement of the lever 130, the rollers 162 are held in rolling contact with the projecting pins 216, with a small amount of friction therebetween.

When the projecting pins 216 have been lowered below the position of the axes of the rollers 162, the lever 130 is pivoted in the reverse direction toward its fully pivoted position (toward the second fitting portion 11) under the biasing action of the spring 144. Before the lever 130 is pivoted to its fully pivoted position defined by the stop 148, the connecting member 172 placed in its fully lowered position comes into abutting contact with the upper surface 217 of the bottom wall of the nozzle body 200, with a result of communication of the passage 184 with the passage 218 communicating with the suction tube 202. The nozzle holder 102 is further lowered. This lowering movement of the nozzle holder 102 is permitted by compression of the spring 174. After the lever 130 has been placed in its fully pivoted position defined by the stop 148, the nozzle holder 102 is further lowered by a small distance to its fully lowered position in which the lever 130 is held in its fully pivoted position (defined by the stop 148), with the rollers 162 being spaced apart from the projecting pins 216.

When the nozzle holder 102 has been lowered to its fully lowered position, the removal-preventive plate 276 is moved to its non-operated position, and the nozzle holder 102 is then moved upwards from the fully lowered position. During this upward movement of the nozzle holder 102, the rollers 162 which are spaced apart from the projecting pins 216 in the fully lowered position of the nozzle holder 102 come into rolling contact with the projecting pins 216, so that the suction nozzle 100 is subsequently moved upwards together with the nozzle holder 102, and is thus taken out of the nozzle holding hole 264.

In the state in which the suction nozzle 100 is outside the nozzle-accommodating device 260, with the rollers 162 in contact with the projecting pins 216, the connecting member 172 is held in abutting contact with the upper surface 217 of the bottom wall of the nozzle body 200, and is placed in a lifted position spaced upwards from the fully lowered position. In this lifted position of the connecting member 172, the biasing force of the spring 174 acts on the suction nozzle 100 through the connecting member 172, so that the suction nozzle 100 and the nozzle holder 102 are biased toward each other.

In this state, the lever 130 is placed in the fully pivoted position defined by the stop 148, and cannot be further pivoted from this fully pivoted position in the direction toward the projecting pins 216. Further, since the biasing force of the spring 174 is smaller than that of the spring 144, the lever 130 cannot be pivoted from the fully pivoted position in the direction away from the projecting pins 216, either. Thus, the lever 130 functions as if it were a stationary member, and does not function to press the first fitting portion 210 against the second fitting portion 110 through the rollers 162 in the radial direction of the fitting portions 210, 110. However, the biasing force of the spring 174 acts on the suction nozzle 100 in the direction toward its lower end, and the direction of abutting contact of the rollers 162 with the projecting pins 216 is inclined with respect to a horizontal plane including the common axis of the rollers 162, with this common axis being located below the centerlines of the pins 216. As a result, the abutting contact of the rollers 162 with the pins 216 has an effect of generating a force by which the first and second fitting portions 210, 110 are pressed against each other in the radial direction, so that the first fitting portion 210 is moved in the radial direction with the straight inner circumferential surface 212 being forced against the straight outer circumferential surface 108.

The lever 130 contacts with the projecting pins 216 through the cylindrical outer circumferential surfaces of the rollers 162, and the rollers 162 are rotatably mounted on the bent-end portion 158 of the lever 130, which is inclined with respect to the vertical direction such that the bent-end portion 158 approaches the first fitting portion 110 as the bent-end portion 158 extends downwards. Accordingly, a straight line perpendicular to a straight line passing the axes of the support shaft 132 and the rollers 162 is inclined with respect to a horizontal plane perpendicular to the axes of the first and second fitting portions 210, 110, so that the direction in which the rollers 162 contact the projecting pins 216 is inclined obliquely upwards as viewed in a direction from the common axis of the rollers 162 toward the centerlines of the pins 216. Further, the centerlines of the pins 216 are located above the above-indicated straight line perpendicular to the straight line passing the axes of the support shaft 132 and the rollers 162 of the lever 130. This means a considerable angle of inclination of the direction of the abutting contact of the rollers 162 with the pins 216 with respect to the horizontal plane perpendicular to the axes of the first and second fitting portions 210, 110.

For fitting engagement of the first and second fitting portions 210, 110, a suitable clearance is required between the inner circumferential surface 212 and the outer circumferential surface 108. Since the inner circumferential surface 212 is forced against the outer circumferential surface 108 by the abutting contact of the rollers 162 with the pins 216, at a circumferential position corresponding to the midpoint between the two rollers 162, the clearance or gap between the surfaces 212, 108 is zeroed at this circumferential position, as shown in FIG. 5. As a result, the first and second fitting portions 210, 110 are positioned relative to each other in the radial direction, such that the clearance or gap increases from zero from the above-indicated circumferential position (contacting circumferential position) in the opposite circumferential directions, to a maximum value δ at a circumferential position diametrically opposite to the contacting circumferential position, as shown in FIG. 5. It is noted that the maximum clearance is exaggeratedly shown in FIG. 5 so as to be considerably larger than it is, for easier understanding. Thus, the suction nozzle 100 is held by the nozzle holder 102 such that the predetermined position of the suction nozzle 100 relative to the nozzle holder 102 is maintained, so that the electronic component 32 can be accurately held by suction by the suction nozzle 100 and can be accurately mounted on the printed-wiring board 24, as described below.

Figure 11:
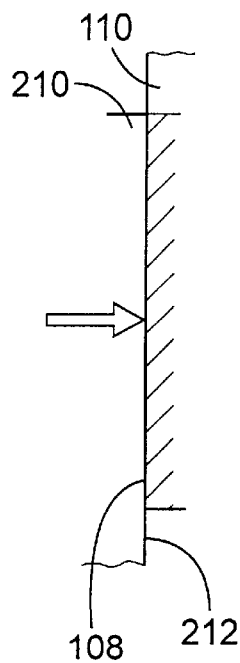
FIG. 11 is a view for explaining a force which is applied from a second fitting portion to a first fitting portion in a radial direction when the suction nozzle is mounted on the nozzle holder.
Figure 12:
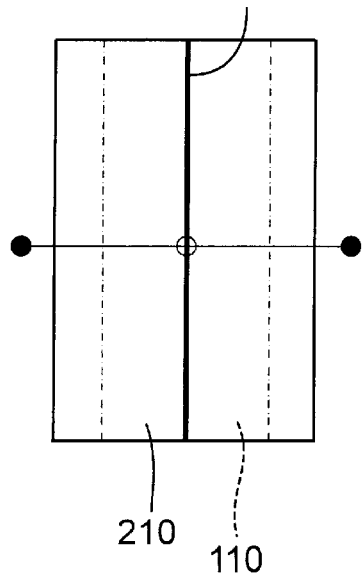
FIG. 12 is a view for explaining forces which are applied from the suction nozzle to the nozzle holder in the axial and circumferential directions when the suction nozzle is mounted on the nozzle holder.

In the present embodiment wherein the projecting pins 216 are disposed at an axial position of the first fitting portion 210, which is slightly above the axially midpoint of the first fitting portion 210, the pins 216 are located at an axially middle portion (at a substantially axially central portion) of the mutually fitting parts of the inner and outer circumferential surfaces 212, 108, so that a force for forcing the inner circumferential surface 212 against the outer circumferential surface 108 is applied in the radial direction to the substantially axially central part of the mutually fitting parts (indicated by hatched lines in FIG. 11 of the first and second fitting portions 210, 110, as indicated by arrow in FIG. 11. Accordingly, the inner and outer circumferential surfaces 212, 108 are held in close contact with each other along a generating line of each circumferential surface 212, 108, as indicated by solid thick line in FIG. 12. The generating line passes a point (indicated by a white dot in FIG. 12) at which the force is applied to the first fitting portion 210 by the abutting contact of the rollers 162 with the projecting pins 216. The inner and outer circumferential surfaces 212, 108 are held in close contact with each other along the generating line on opposite sides of the above-indicated point in the axial direction of the first and second fitting portions 210, 110. This close contact prevents an inclination of the axes of the first and second fitting portions 210, 110 relative to each other.

As described above, the rollers 162 contact the projecting pins 216 in the obliquely upward direction inclined with respect to the horizontal direction perpendicular to the axes of the first and second fitting portions 210, 110. That is, the direction of contact of the rollers 162 with the pins 216 includes a component in the upward direction, so that the movement of the suction nozzle 100 relative to the nozzle holder 102 in the direction from the nozzle holder 102 toward the lower end of the suction nozzle 100 is prevented when the first and second fitting portions 210, 110 are forced against each other. Accordingly, a predetermined relative position of the suction nozzle 100 and the nozzle holder 102 in the axial direction is maintained. Further, a force acts on the first fitting portion 210 in the upward direction so that the removal of the suction nozzle 100 from the nozzle holder 102 is prevented. The arrangement described above is effective to maintain pressed contact of the connecting member 172 with the upper surface 217 of the bottom wall of the nozzle body 200, thereby maintaining pressure-tight communication between the passage 184 formed through the connecting member 172 and the passage 218 formed through the nozzle body 200, while the suction nozzle 100 is held by the nozzle holder 102.

In the present embodiment, the two projecting pins 216 are disposed coaxially with each other, and lie on a horizontal plane perpendicular to the axes of the first and second fitting portions 210, 110. Accordingly, the directions of abutting contact of the two rollers 162 with the respective two pins 218 are parallel to each other, so that the lever 130 can be pivoted about the nominal pivot axis parallel to the common axis of the pins 216. In addition, the two sets of roller 162 and pin 216 are located on the respective opposite sides of a vertical plane which includes the axes of the first and second fitting portions 210, 110 and which is parallel to the direction of contact of the rollers 162 with the pins 216. Accordingly, the abutting contact of the rollers 162 with the pins 216 is effective to establish the predetermined angular position of the suction nozzle 100 relative to the nozzle holder 102, and prevent rotation of the suction nozzle 100 and the nozzle holder 102 relative to each other after the predetermined angular position has been established. Further, the two rollers 162 are disposed on the single lever 130 which is a substantially rigid member and which is supported by the bracket 116 with high rigidity, so that the predetermined position of the suction nozzle 100 relative to the nozzle holder 102 is maintained.

When the nozzle holder 102 is lowered to effect fitting engagement of the second fitting portion 110 with the first fitting portion 210 of the suction nozzle 100, the nozzle holder 102 is placed in the predetermined nozzle-mounting angular position for mounting the suction nozzle 100. In this predetermined nozzle-mounting angular position, the two rollers 162 are aligned with the two pins 216 in the circumferential direction of the first and second fitting portions 210, 110. If the two rollers 162 are not accurately aligned with the two pins 216, or are slightly misaligned with the two pins 216, one of the two rollers 162 is first brought into contact with the corresponding pin 216, so that the suction nozzle 100 is rotated until the other roller 162 comes into contact with the corresponding pin 216. Thus, the two rollers 162 are eventually brought into contact with the respective pins 216, at respective two points (indicated by black dots in FIG. 12) which are located on the opposite sides of the point (indicated by the white dot in FIG. 12) at which the force is applied to the first fitting portion 210 in the radially inward direction toward the second fitting portion 110 for pressing contact of the inner and outer circumferential surfaces 212, 108 with each other. In this state, the two rollers 162 in abutting contact with the respective two pins 216 are located on the same side of a vertical plane which includes the centerlines of the pins 216 and which is parallel to the axes of the first and second fitting portions 210, 110. Since the same amounts of angular moment (torque) are applied to the suction nozzle 100 in the opposite circumferential directions of the circumferential surfaces 212, 108, the rotation of the first and second fitting portions 210, 110 relative to each other is prevented by the rollers 162 in contact with the pins 216. In the presence of the low-friction coating 213 provided on the inner circumferential surface 212, the suction nozzle 100 can be smoothly rotated relative to the nozzle holder 102 when only one of the two rollers 162 is initially brought into contact with the corresponding pin 216.

When the nozzle holder 102 has been lowered to its fully lowered position, the rollers 162 are spaced apart from the projecting pins 216. In this state, however, the suction nozzle 100 is unlikely to be rotated within the nozzle holding member 262, and the angle of rotation of the suction nozzle 100 if any is very small. Accordingly, when the two rollers 162 are subsequently brought into contact with the pins 216 as a result of the upward movement of the nozzle holder 102 to take out the suction nozzle 100 from the nozzle holding member 262, the suction nozzle 100 is rotated relative to the nozzle holder 102, if the actual angular position of the suction nozzle 100 more or less deviates from the predetermined nozzle-removal angular position described above. Thus, while the suction nozzle 100 taken out from the nozzle-accommodating device 260 by the upward movement of the nozzle holder 102 is held by the nozzle holder 102, the two rollers 162 are held in abutting contact with the pins 216, thereby preventing the suction nozzle 100 from being rotated relative to the nozzle holder 102. In addition, the two rollers 162 in contact with the respective pins 216 are supported by the substantially rigid lever 130, so that the predetermined angular position of the suction nozzle 100 relative to the nozzle holder 102 is maintained with high stability by the two rollers 162 in contact with the respective pins 216. The first and second fitting portions 210, 110 are forced against each other in the radial direction by the abutting contact of the two rollers 162 with the respective pins 216, and an axial force can be transmitted from the nozzle holder 102 to the suction nozzle 100. It is also noted that the points of contact of the rollers 162 with the pins 216 and the line of contact between the inner and outer circumferential surfaces 212, 108 substantially lie on the same vertical plane. Further, the same amounts of force are applied from the two rollers 162 to the respective two pins 216.

Since the predetermined angular position of the suction nozzle 100 relative to the nozzle holder 102 is established when the suction nozzle 100 is mounted on the nozzle holder 102, the predetermined angular position of the suction nozzle 100 can be established with a high degree of consistency or reproducibility, when the same suction nozzle 100 is repeatedly mounted and removed on and from the nozzle holder 102. Accordingly, the circumferential position of the suction nozzle 100 at which the maximum amount of radial clearance is left between the suction nozzle 100 and the nozzle holder 102 is held constant when the suction nozzle 100 is repeatedly mounted and removed on and from the nozzle holder 102. Namely, the direction in which the center position of the suction nozzle 100 is offset from that of the nozzle holder 102, and the angular position of the nozzle holder 100 relative to the nozzle holder 102 are both maintained constant.

As described above, the axial position of the suction nozzle 100 as mounted on the nozzle holder 102 is determined by the engagement of the rollers 162 with the projecting pins 216. The suction nozzle 100 is held by the nozzle holder 102 by the axial force which is applied to the suction nozzle 100 by the engagement of the rollers 162 with the pins 216. The axial position of the suction nozzle 100 is determined by the position of the lever 130, which is considered to be a stationary member when the lever 130 placed in the fully pivoted position holds the suction nozzle 100. Accordingly, the position of the lower end of the suction tube 202 of the suction nozzle 100 in the axial direction (in the vertical direction in this embodiment) can be adjusted by adjusting the fully pivoted position of the lever 130 defined by the stop 148. Further, the predetermined axial position of the suction nozzle 100 can be maintained irrespective of an increasing amount of wear of the rollers 162, by adjusting the fully pivoted position of the lever 130, so that the axial position of the lower end of the suction nozzle 100 can be accurately controlled when the electric component 32 is picked up by the suction nozzle 100 and is mounted on the printed-wiring board 24.

Then, the manner of removing the suction nozzle 100 from the nozzle holder 102 will be described. To remove the suction nozzle 100 from the nozzle holder 102, the suction nozzle 100 is moved to a position right above the nozzle holding hole 264 which is empty. At this time, the nozzle holder 102 is rotated to its predetermined nozzle-removal angular position. On the other hand, the removal-preventive plate 276 of the nozzle-accommodating device 260 is placed in the non-operated position. In this state, the suction nozzle 100 is lowered with the nozzle holder 102, so that the light-emitting plate 204 and the suction tube 202 are fitted into the large-diameter and small-diameter portions 268, 266 of the nozzle holding hole 264, respectively. Then, the removal-preventive plate 274 is moved to its operated position in which the removal-preventive portion 284 is located above the light-emitting plate 204. Subsequently, the nozzle holder 102 is moved upwards while the suction nozzle 100 is prevented from being moved upwards, with the removal-preventive portion 284 in engagement with the light-emitting plate 204. While the suction nozzle 100 is accommodated in the nozzle-accommodating device 260, a torque is rarely applied to the suction nozzle 100, so that the suction nozzle 100 is substantially held in its predetermined nozzle-removal angular position in which the suction nozzle 100 was returned to the nozzle-accommodating device 260.

When the nozzle holder 102 is moved upwards, a reaction force is applied from the removal-preventive portion 284 to the suction nozzle 100, for preventing the removal of the suction nozzle 100 from the nozzle holding hole 264. When this reaction force has exceeded the biasing force of the spring 144, the lever 130 is pivoted against the biasing force of the spring 144, to permit the removal of the suction nozzle 100 from the nozzle holder 102. The suction nozzle 100 is held by the nozzle holding member 262 and is thus accommodated in the nozzle-accommodating device 260, while the lever 130 is returned to its fully pivoted position by the biasing force of the spring 144. The nozzle holder 102 is moved to a position right above the next suction nozzle 100 to be mounted on the nozzle holder 102.

After the suction nozzle 100 has been mounted on the nozzle holder 102 of each of the three component-mounting units 30, an operation to mount the electric components 32 on the printed-wiring board 24 is performed by the three component-mounting units 30, with movements of the units 30 in the XY plane by the XY robot 48.

Where the electric component 32 to be held by the suction nozzle 100 is relatively small, the suction tube 202 has a relatively small diameter, and a difference between the width of the electric component 32 and the diameter of the suction tube 202 is relatively small, so that there is a risk of partial projection of the end face of the suction tube 202 beyond the periphery of the electric component 32 in the radial direction when the electric component 32 is held by suction by the suction nozzle 100. In some cases, some amount of partial projection of the end face of the suction tube 202 beyond the periphery of the electric component 32 is inevitable. Accordingly, the end face of the suction tube 202 must be accurately aligned with the electric component 32 to prevent the above-indicated partial projection of the suction tube 202, which may cause a portion of the opening in the end face of the suction tube 202 to be located outside the surface of the electric component 32. For accurate alignment of the end face of the suction tube 202 with the electric component 32 in the radial direction of the suction tube 202, the operation to mount the electric component 32 on the printed-wiring board 24 is preceded by an operation to detect an error of the center position of the suction nozzle 100 with respect to the axis of the nozzle holder 102 due to the clearance between the first and second fitting portions 210, 110.

Figure 13:
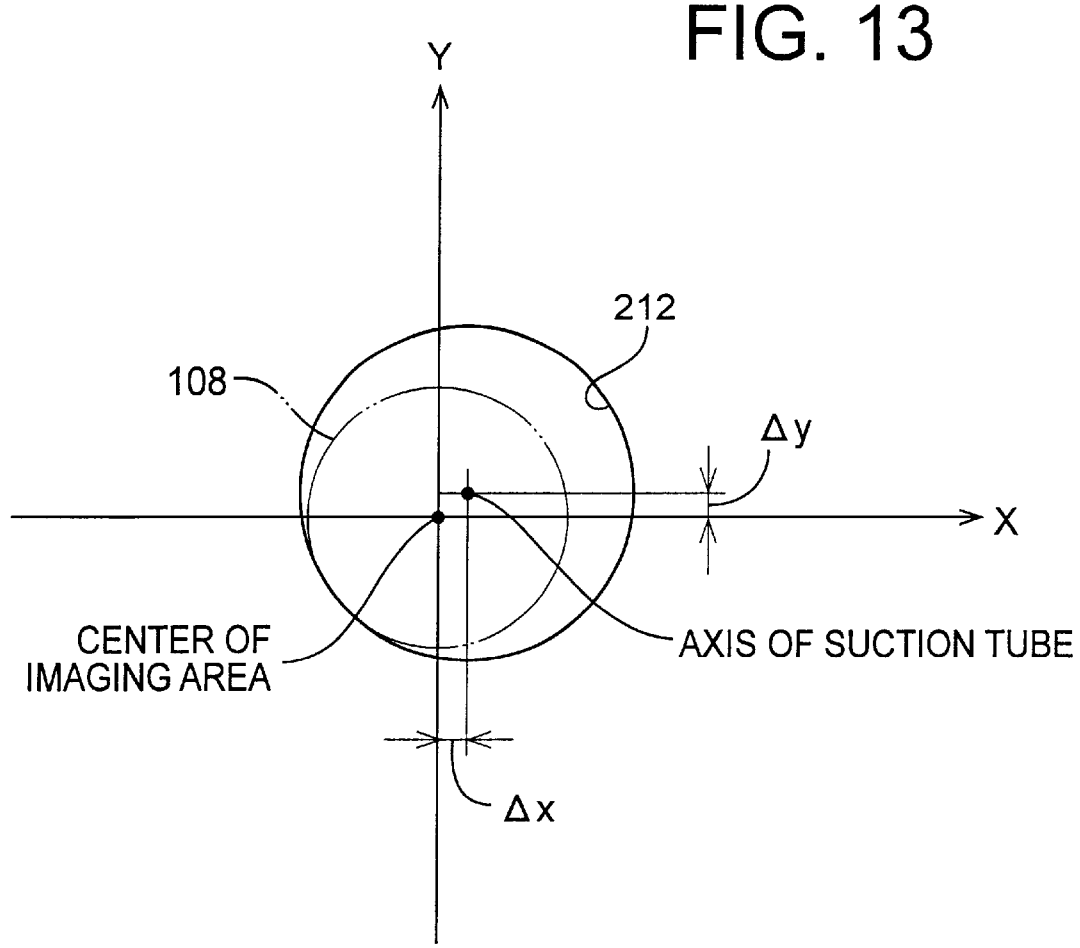
FIG. 13 is a view for explaining a positioning error of the center of the suction nozzle as held on the nozzle holder in the component-mounting head.

After the suction nozzle 100 has been held by the nozzle holder 102 and before the electric component 32 is held by the suction nozzle 100, the nozzle holder 102 is moved to a position right above the image-taking device 240, and an image of the end face of the suction tube 202 is taken by the image-taking device 240. In the present embodiment, the position of the component-mounting head 54 in the XY plane is represented by the position of the axis of the nozzle holder 102. To take the image of the end face of the suction tube 202, the component-mounting head 54 is moved so that the axis of the nozzle holder 102 is aligned with the center of an imaging area of the image-taking device 240. In this state, the image of the end face of the suction tube 202 is taken by the image-taking device 240, and the position of the axis of the suction tube 202 is obtained on the basis of image data representative of the image of the end face, as indicated in FIG. 13. Described more specifically, the deviation of the position of the axis of the suction tube 202 with respect to the center of the imaging area is obtained. The deviation consists of an X-axis component $\Delta x$ and a Y-axis component $\Delta y$ in the respective X-axis and Y-axis directions. The obtained components $\Delta x$ and $\Delta y$ are stored in the RAM 306 of the computer 310. At the same time, the angular position of the nozzle holder 102 when the center position error (the deviation indicated above) of the suction tube 202 was obtained is also stored in the RAM 306. If the center position error of the suction tube 202 is detected when the nozzle holder 102 is placed in the reference angular position in which the sensed member 86 is detected by the reference-position switch 88, for instance, the reference-angular position is stored in the RAM 306. If the center position error of the suction tube 202 is detected when the nozzle holder 102 is placed in an angular position other than the reference angular position, this angular position with respect to the reference angular position is stored in the RAM 306.

While the suction nozzle 100 is held by the nozzle holder 102, the relative position of the suction nozzle 100 and the nozzle holder 102 in their radial position is determined by the pressing contact of the inner and outer circumferential surfaces 212, 108 with each other, and the relative angular position of the suction nozzle 10 and the nozzle holder 102 is determined by the abutting contact of the two rollers 162 with the respective projecting pins 216, while the relative position of the sensed member 86 and the lever 130 about the axis of the nozzle holder 102 is kept unchanged. Accordingly, the detected amount of the center position error of the same suction nozzle 100 is kept unchanged as long as the suction nozzle 100 is kept mounted on the nozzle holder 102. Further, the direction in which the center position error of the suction nozzle 100 can be obtained on the basis of the present angular position of the nozzle holder 102 relative to the angular position in which the center position error was detected. This is also true when the same suction nozzle 100 is once removed from the nozzle holder 102 and is again mounted on the nozzle holder 102.

For mounting the electric component 32 on the printed-wiring board 24, the suction nozzle 100 is moved to a position right above the electric component 32 at the component-supply position in the electric-component supply device 18. Where the suction nozzle 100 is the one for holding the electric component 32 having a relatively small size, and the center position error of the suction nozzle 100 with respect to the nozzle holder 102 is stored in the RAM 306, the position to which the nozzle holder 102 is moved with the suction nozzle 100 for picking up the electric component 32 is compensated for the center position error of the suction nozzle 100, so that the electric component 32 is sucked at its center part by the suction nozzle 100. The amount and direction of the compensation of the position to which the nozzle holder 102 is moved are calculated on the basis of the angular position of the nozzle holder 102 upon holding of the electric component 32, and the amount of the center position error of the suction nozzle 100 with respect to the nozzle holder 102. At the thus compensated position, the component-mounting head 54 is lowered by the vertical drive device 56, so that the electric component 32 can be sucked at its central part by the suction nozzle 100, without partial projection of the end face of the suction tube 202 beyond the periphery of the electric component 32, even where the width of the electric component 32 is only slightly larger than the diameter of the suction tube 202.

The component-mounting head 54 is further lowered by a small distance from the position at which the end face of the suction tube 202 comes into abutting contact with the electric component 32. This additional downward movement of the component-mounting head 54, which assures increased stability of suction of the electric component 32 by the suction tube 202, is allowed by compression of the spring 174 which causes a downward movement of the nozzle holder 102 relative to the suction nozzle 100 while the passage 184 in the connecting member 172 is held in pressure-tight communication with the passage 218 in the nozzle body 200.

The spring 174 also functions to alleviate a shock to be generated upon abutting contact of the suction tube 202 with the electric component 32. As described above, the straight outer circumferential surface 108 is hardened and ground, while the straight circumferential surface 212 is coated with polytetrafluoroethylene to reduce its friction coefficient. Accordingly, the relative movement of the suction nozzle 100 and the nozzle holder 102 with the compression of the spring 174 can be initiated with a reduced shock. The cushioning function of the spring 174 owing to its compression is effective to reduce the shock upon abutting contact of the suction tube 202 with the electric component 32, making it possible to avoid damaging of the electric component 32 and bending or damaging of the suction tube 202. Although the above-indicated additional downward movement of the nozzle holder 102 causes the rollers 162 to be moved apart from the projecting pins 216, the rollers 162 engage the pins 216 upon abutting contact of the suction tube 202 with the electric component 32, so that the electric component 32 is sucked by the suction nozzle 100 while the predetermined position of the suction nozzle 100 relative to the nozzle holder 102 in the radial direction is established.

With the suction tube 202 held in abutting contact with the electric component 32, a negative pressure is applied to the suction tube 202 through the component-mounting head 54, for the suction tube 202 to suck the electric component 32. After the electric component 32 is sucked by the suction tube 202 of the suction nozzle 100, the component-mounting head 54 is moved upwards to pick up the electric component 32 from the electric-component supply device 18. During the upward movement of the head 54, the rollers 162 engage the pins 216, so that the electric component 32 sucked by the suction tube 202 is moved upwards while the predetermined radial and angular positions of the suction nozzle 100 relative to the nozzle holder 102 are established.

After the electric components 32 have been held by all of the three component-mounting heads 54, the electric components 32 are moved onto the printed-wiring board 24. During these movements of the electric components 32, the heads 54 are successively stopped at a position right above the image-taking device 240, and the images of the electric components 32 held by the suction nozzles 100 of the three heads 54 are successively taken. Positioning errors of the electric components 32 as held by the suction nozzles 100 are obtained on the basis of image data representative of the images of the electric components 32. In the present embodiment, the positioning error of each electric component 32 includes center position error and an angular position error. The center position error consists of amounts of deviation of the center position of the electric component 32 with respect to the axis of rotation of the suction nozzle 100 (more precisely, the axis of rotation of the nozzle holder 102) in the mutually perpendicular two directions (X-axis and Y-axis directions in this embodiment) in the plane perpendicular to the axis of the suction tube 202. The angular position error is an error of the angular position of the electric component 32 about the axis of rotation of the suction nozzle 100.

After the imaging of the electric components 32, the component-mounting heads 54 are moved onto the printed-wiring board 24, and the electric components 32 are mounted at respective predetermined positions on the printed-wiring board 24. At this time, the positions to which the component-mounting heads 54 are moved for mounting the electric components 32 on the printed-wiring board 24 are compensated for the center position errors of the electric components 32, and the angular positions of the component-mounting heads 54 are compensated for the angular position errors of the electric components 32. The compensation of the angular position of each head 54 is effected by the rotary drive device 58 by rotating the nozzle holder 102. Since the rotation of the suction nozzle 100 relative to the nozzle holder 102 is prevented by the engagement of the roller 162 with the projecting pins 216, a rotary motion of the nozzle holder 102 is transmitted to the suction nozzle 100, so that the electric component 32 is rotated. The amount of compensation of the position to which each component-mounting head 54 is moved includes a positioning error of the printed-wiring board 24. Before the electric components 32 are mounted on the printed-wiring board 24, the positioning error of the board 24 is obtained on the basis of image data representative of images of fiducial marks provided on the board 24, which images are taken by the image-taking device 52. The positions to which the heads 54 are moved for mounting the electric component 32 on the printed-wiring board 24 are compensated for the obtained positioning error of the board 24, so that the electric components 32 can be accurately mounted with the predetermined attitude at the predetermined mounting positions on the board 24.

When each component-mounting head 54 has been moved to the component-mounting position on the printed-wiring board 24, the head 54 is lowered to mount the electric component 32 onto the board 24. The head 54 is lowered a further distance from the position at which the electric component 32 contacts the surface of the board 24. This additional downward movement of the head 54, which is allowed by the compression of the spring 174, assures improved stability of mounting of the electric component 32 on the printed-wiring board 24. The spring 174 also functions to alleviate a shock to be generated upon abutting contact of the electric component 32 with the board 24. The cushioning function of the spring 174 is effective to reduce the frictional resistance to the relative movement of the suction nozzle 100 and the nozzle holder 102 in the axial direction, and reduce the shock upon initiation of the relative movement of the suction nozzle 100 and the nozzle holder 102, as described above with respect to the cushioning function of the spring 174 when the electric component 32 is sucked by the suction nozzle 100.

The above-indicated additional downward movement of the nozzle holder 102 from the position of abutting contact of the electric component 32 with the printed-wiring board 24 causes the rollers 162 to be moved apart from the projecting pins 216. When the electric component 32 is brought into abutting contact with the printed-wiring board, 24, however, the rollers 162 engage the pins 216, forcing the first fitting portion 210 onto the second fitting portion 110, so that the electric component 32 is mounted on the board 24 while the predetermined angular and radial positions of the suction nozzle 100 relative to the nozzle holder 102 are established. After the rollers 162 are moved apart from the pins 216, the electric component 32 is forced onto the printed-wiring board 24 under the biasing force of the spring 174, so that the electric component 32 is not displaced from the predetermined mounting position. The suction nozzle 100 is held pressed against the nozzle holder 102 during imaging and mounting of the electric component 32, so that the relative radial position of the suction nozzle 100 and the nozzle holder 102 is not changed. Accordingly, the electric component 32 can be accurately mounted at the predetermined position on the printed-wiring board 24, owing to the compensation of the position of the component-mounting head 54 for the center position error of the component 32 obtained on the basis of its image taken by the image-taking device 240. This accurate mounting of the electric component 32 at the predetermined position is possible not only where the electric component 32 is relatively large and can be sucked by the suction nozzle 100 without partial projection of the end face of the suction tube 202 beyond the periphery of the electric component 32, without compensation of the position of the nozzle holder 102, but also where the electric component 32 is relatively small, and the position of the nozzle holder 102 is compensated to permit the electric component 32 to be sucked at its central part.

During the imaging and mounting of the electric component 32, the suction nozzle 100 is prevented from rotating relative to the nozzle holder 102, and the relative angular position of the suction nozzle 100 and the nozzle holder 102 is held unchanged, so that the electric component 32 can be mounted in the predetermined attitude on the printed-wiring board 24, by rotating the nozzle holder 102 to rotate the suction nozzle 100 on the basis of the angular positioning error of the electric component 32 obtained on the basis of its image taken by the image-taking device 240. After the electric component 32 is mounted on the printed-wiring board 24 with the rollers 162 spaced apart from the projecting pins 216, the rollers 162 are again brought into contact with the pins 216 during the upward movement of the component-mounting head 54, so that the predetermined radial and angular positions of the suction nozzle 100 relative to the nozzle holder 102 are maintained for the subsequent operation to hold and mount the next electric component 32.

It will be understood from the foregoing description of the present embodiment that the bracket 116 fixed to the nozzle holder 102 constitutes a movable-member holding device for pivotally holding a movable member in the form of the lever 130, and cooperates with the lever 130, springs 144, 174, stop 148 and projecting pins 216 to constitute a pressing device for forcing the first and second fitting portions 210, 110 against each other. It will also be understood that a center-position-error detecting portion for detecting the center position error of the suction nozzle 100 is constituted by a portion of the computer 310 assigned to detect the center position error of the suction nozzle 100 with respect to the nozzle holder 102 on the basis of image data representative of an image of the end face of the suction tube 202. The above-indicated portion of the computer 310 may be considered to constitute a fitting-clearance detecting portion for detecting the clearance between the first and second fitting portions 210, 110. It will further be understood that a center-position-error correcting portion is constituted by a portion of the computer 310 assigned to compensate the component-sucking position of the nozzle holder 102 (at which the electric component 32 is sucked by the suction nozzle 100), for the detected center position error of the suction nozzle 100.

Figure 14:
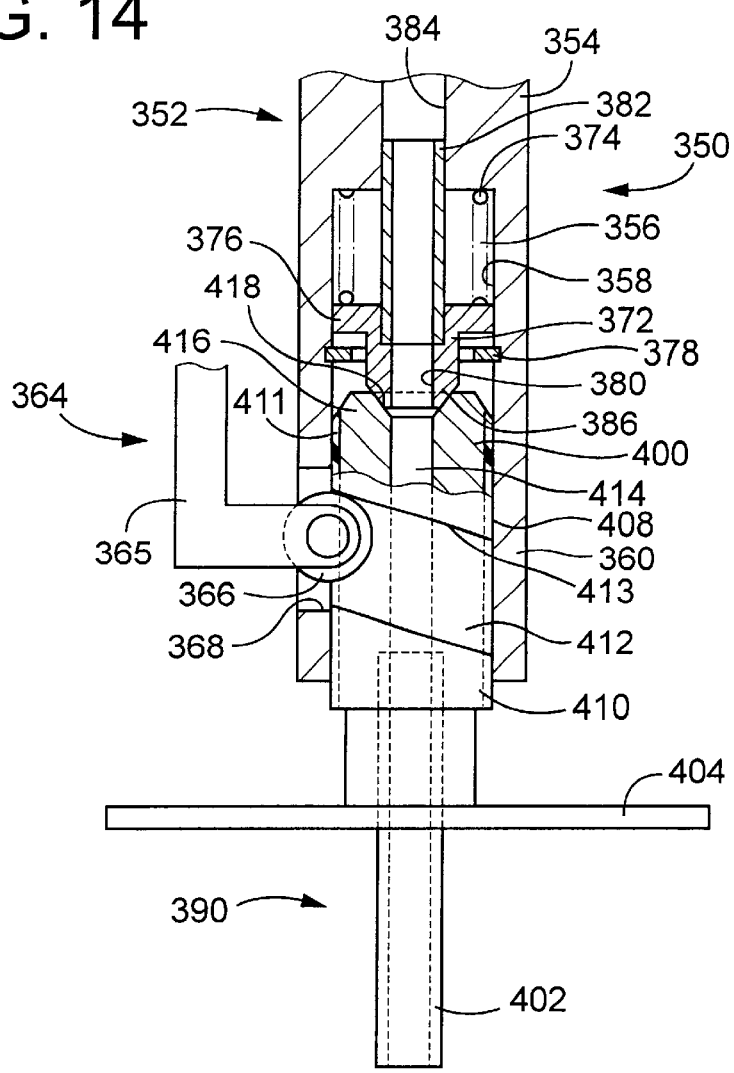
FIG. 14 is a front elevational view partly in cross section of the suction nozzle as mounted on the nozzle holder by a nozzle-mounting device constructed according to another embodiment of this invention.
Figure 15:
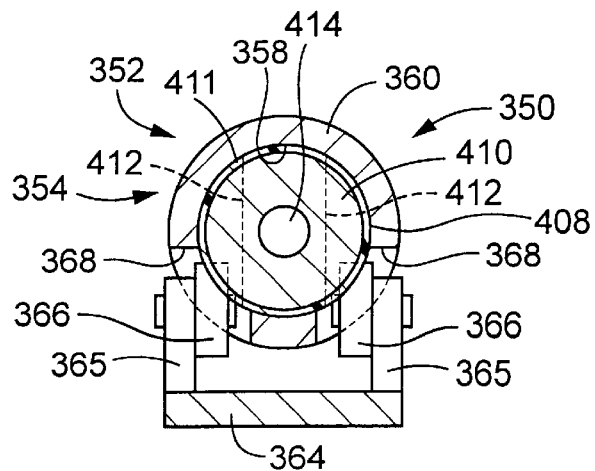
FIG. 15 is a plan view partly in cross section showing the suction nozzle of FIG. 14 as mounted on the nozzle holder.

In the embodiment described above, the suction nozzle 100 includes the first fitting portion 210 having the straight inner circumferential surface 212 while the nozzle holder 102 includes the second fitting portion 110 having the straight outer circumferential surface 108. However, it is possible that the nozzle holder includes a first fitting portion having an inner circumferential surface, while the suction nozzle includes a second fitting portion having an outer circumferential surface. Referring to FIGS. 14 and 15, there will be described a second embodiment of this invention which employs the above-indicated modification.

The electric-component mounting system according to the second embodiment includes a plurality of component-mounting heads 350 one of which is shown in FIGS. 14 and 15. Each component-mounting head 350 includes a nozzle holder 352 having a holder body 354 having a circular shape in transverse cross section. The holder body 354 is open at its lower end, and has a constant-diameter fitting hole 356 partly defined by a straight inner circumferential surface 358 having a constant diameter. A portion of the holder body 354 in which the inner circumferential surface 358 is formed functions as a first fitting portion 360. In the present second embodiment, the straight inner circumferential surface 358 is hardened, annealed and ground.

The holder body 354 carries a pivotable member as a movable member in the form of a lever 364 pivotally mounted thereon, like the lever 130 used in the first embodiment. The lever 364, which generally extends in the axial direction of the holder body 354, is bent at its lower end portion so as to extend in the radial direction of the holder body 354 toward the first fitting portion 360. The lever 364 includes two arm portions 365 which are spaced apart from each other in a direction parallel to diametric direction of the first fitting portion 360. The two arm portions 365 carry respective rollers 366 mounted thereon rotatably about a horizontal axis parallel to the direction in which the two arm portions 365 are spaced apart from each other. The rollers 365 constitute a second abutting portion. When the leer 364 is placed in its fully pivoted position under a biasing force of a spring (not shown), the rollers 366 partly protrude into the constant-diameter fitting hole 356 (having the inner circumferential surface 358) through an opening 368 formed through the cylindrical wall of the first fitting portion 360.

The fully pivoted position of the lever 364 is defined by a stop (not shown).

Within the fitting hole 356 of the holder body 354, there is fitted a connecting member 372 such that the connecting member 362 is axially movable relative to the holder body 354. The connecting member 362 is biased by a compression coil spring 374 (hereinafter referred to simply as "spring 374) in a direction toward the open end of the fitting hole 356, that is, in the downward direction. The connecting member 372 has a circular cross section in transverse cross section, and includes a flange portion 376, which is provided for abutting contact with a stop 378 to define the fully lowered position of the connecting member 372 biased by the spring 374. The connecting member 372 has a passage 380 formed through its radially central portion. A lower end portion of a sleeve 382 is fixedly fitted in the upper end portion of the passage 380, while an upper end portion of the sleeve 382 is slidably fitted in a passage 384 formed through the holder body 354 coaxially with the fitting hole 356. The upper end portion of the sleeve 382 is axially movable in the passage 384. A negative pressure is applied to the passage 380 through the passage 384 and the sleeve 382. The connecting member 372 includes a tapered fitting protrusion 386 at its lower end. The diameter of the tapered fitting protrusion 386 decreases in the downward direction.

The component-mounting head 350 further includes a suction nozzle 390, which includes a nozzle body 400, a suction tube 402 and a light-emitting plate 404. The nozzle body 400 has a circular shape in transverse cross section, and includes a second fitting portion 410 having a straight circumferential surface 408 having a constant diameter. In the present embodiment, the outer circumferential surface 408 is covered with a low-friction coasting 411 formed of polytetrafluoroethylene. The second fitting portion 408 has two cutouts 412 formed in an axially intermediate portion thereof, at respective circumferential positions which are opposed to each other diametrically of the outer circumferential surface 408. These two cutouts 412 are open in the outer circumferential surface 408, and have a width larger than the diameter of the rollers 366. The cutouts 412 are inclined with respect to the horizontal direction (horizontal plane perpendicular to the axis of the second fitting portion 410), and each of the cutouts 412 has an upper side surface 413 which functions as a first abutting portion for abutting contact with the second abutting portion in the form of the rollers 366.

The nozzle body 400 has a passage 414 formed through its radially central portion. The passage 414 is held in communication with the suction tube 402. The nozzle body 400 includes a tapered guide portion 416 at its upper end remote from the suction tube 402. The diameter of the tapered guide portion 416 decreases in the downward direction. The tapered guide portion 416 has a fitting recess 418 whose circumferential surface is tapered for contact with the tapered fitting protrusion 386 described above.

For mounting the suction nozzle 390 on the nozzle holder 352, the nozzle holder 352 is lowered so that the first fitting portion 360 is fitted on the second fitting portion 410, for engagement of the straight inner circumferential surface 358 with the straight outer circumferential surface 408. At this time, the nozzle holder 352 is placed in a nozzle-mounting angular position for mounting the suction nozzle 390. In this angular position, the two rollers 366 disposed on the lever 366 and partly extending through the opening 368 formed through the first fitting portion 360 are located at the circumferential positions of the second fitting portion 410 which correspond to the upper end portions of the cutouts 412 which are nearer to the nozzle holder 352. When the rollers 366 come into contact with the tapered annular peripheral surface of the guide portion 416 of the second fitting portion 410, the lever 364 is pivoted against the biasing force of the lever-biasing spring so that the rollers 366 are moved out of the fitting hole 358, permitting the second fitting portion 410 to be fitted into the fitting hole 358 of the first fitting portion 360.

When the connecting member 372 comes into abutting contact with the second fitting portion 410, more precisely, when the fitting protrusion 386 is brought into engagement with the fitting recess 418, the connecting member 372 is moved toward the spring 374 against the biasing force of the spring 374. When the entire diameter of the rollers 366 is brought into alignment with the upper ends of the cutouts 412, the rollers 366 are moved into the upper end portions of the cutouts 412 while the lever 366 is pivoted under the biasing force of the lever-biasing spring, so that the rollers 366 contact the upper side surfaces 413 of the cutouts 412, at their outer circumferential surfaces. After the nozzle holder 352 has been lowered to its fully lowered position, it is moved upwards. At this time, the suction nozzle 390 is held by the nozzle holder 352 with the abutting contact of the rollers 366 with the upper side surfaces 413, so that the suction nozzle 390 is taken out of the nozzle-accommodating device as the nozzle holder 352 is moved upwards.

When the suction nozzle 390 is mounted on the nozzle holder 352, the nozzle holder 352 is placed in the predetermined nozzle-mounting angular position in which the two rollers 366 on the lever 364 are aligned with the upper ends of the cutouts 412 formed in the suction nozzle 390, as described above, so that the rollers 366 can be moved into the upper end portions of the cutouts 412. If the suction nozzle 390 has a small amount of angular positioning error with respect to the nozzle-mounting angular position of the nozzle holder 352, one of the two rollers 366 first contacts the upper side surface 413 of the corresponding cutout 412, causing the suction nozzle 390 to be rotated by that roller 366 until the two rollers 366 contact the upper side surfaces 413 of the two cutouts 412. The two rollers 366 are held in contact with the upper side surfaces 413 even after the suction nozzle 390 is taken out of the nozzle-accommodating device. Accordingly, the suction nozzle 390 can be mounted on the nozzle holder 352 in the predetermined radial, axial and angular positions of the suction nozzle 390 relative to the nozzle holder 352, so as to prevent removal of the suction nozzle 390 from the nozzle holder 352.

The upper side surfaces 413 are formed such that they are inclined downwards in the tangential direction of the outer circumferential surface 408 of the second fitting portion 410, such that the upper ends of the inclined surfaces 413 are located on the side of the rollers 366. The rollers 366 are brought into contact with the upper end portions of the thus inclined upper side surfaces 413, so that the second fitting portion 410 is forced onto the first fitting portion 360 owing to an effect of the inclined upper side surfaces 413. The upper ends of the inclined upper side surfaces 413 are located at an axially middle or central portion of the mutually fitting parts of the inner and outer circumferential surfaces 358, 408, so that the rollers 366 contact the upper side surfaces 413 at the axially middle portion of the above-indicated mutually fitting parts. With the abutting contact of the rollers 366 with the upper end portions of the upper side surfaces 413, the inner and outer circumferential surfaces 358, 408 are held in close contact with each other along a generating line of each circumferential surface 358, 408, so that the predetermined relative position of the suction nozzle 390 and the nozzle holder 352 in the radial direction is established, and an inclination of the axes of the suction nozzle 390 and nozzle holder 352 relative to each other is prevented. Further, an axial force acts on the suction nozzle 390 in a direction that causes the suction nozzle 390 to move into the nozzle holder 352. In addition, the lever 364 is considered to be a substantially rigid member, and the two rollers 366 are brought into contact with the upper side surfaces 413 of the cutouts 412 in the two parallel tangential directions of the inner and outer surfaces 358, 408 of the first and second fitting portions 360, 410. Accordingly, when only one of the two rollers 366 initially contacts the upper side surface 413 of the corresponding cutout 412, the suction nozzle 390 is rotated relative to the nozzle holder 352 until the two rollers 366 contact the upper side surfaces 4123 of the respective cutouts 412. Since the same amounts of angular moment (torque) are applied to the suction nozzle 390 in the opposite circumferential directions of the circumferential surface 408, the rotation of the suction nozzle 390 and the nozzle holder 352 relative to each other is prevented by the rollers 366 in contact with the upper side surfaces 413, and the predetermined relative angular position of the suction nozzle 390 and nozzle holder 352 is maintained. Although the fully pivoted position of the lever 364 is defined by the stop, the upper side surfaces 413 of the cutouts 412 are forced by the spring 374 onto the rollers 366, so as to establish the predetermined relative radial, angular and axial positions of the suction nozzle 390 and nozzle holder 352.

While the suction nozzle 390 is held by the nozzle holder 352 in the manner described above, the passage 380 formed through the connecting member 372 is held in communication with the passage 414 formed through the nozzle body 400, and the negative pressure is applied to the suction nozzle 390 through the sleeve 382 and the passages 380, 414.

In the first and second embodiments described above, the fully pivoted position of the lever 130, 364 biased by the spring 144 is defined by the stop 148. However, the stop 148 is not essential, and may be eliminated. In this case, the inner circumferential surface 323, 358 and the outer circumferential surface 108, 408 are forced against each other by the biasing force of the spring 144.

In the illustrated embodiments, a force for forcing the inner circumferential surface 212, 358 and the outer circumferential surface 108, 408 against each other acts on an axially middle or central portion of the mutually fitting parts of the inner and outer circumferential surfaces. However, the force need not act on the axially middle portion of the mutually fitting parts, but may act on an axially intermediate portion of the mutually fitting parts, for instance on an axial portion which is offset from the axially central portion and is nearer to one of the opposite axial ends of the mutually fitting parts.

The illuminating device used for taking an image of the electric component 32 as held by the suction nozzle may include a diffusing plate attached to the suction nozzle, and a lamp disposed above the diffusing plate. In this case, a light emitted from the lamp is transmitted through the diffusing plate, so that the electric component 32 is irradiated with the thus diffused light. The diffusing plate as well as the light-emitting plate is considered to be a sort of light-emitting body. The light-emitting body used in the illuminated device may be provided with a light-emitting member such as a light-emitting diode, or may be arranged to emit a light by itself.

The image-taking device may be adapted to take a normal image of the electric component 32, rather than a projection or silhouette image of the same. In this case, an illuminating device is disposed near the image-taking device, to irradiate the electric component 32 with a visible light, and a normal image of the electric component 32 is taken on the basis of a portion of the visible light reflected by the electric component 32. To prevent formation of a projection or silhouette image of the electric component, it is desirable to use a non-reflecting plate in place of the light-emitting plate, to prevent light reflection by background elements of the component-mounting head toward the electric component 32, so that only the normal image of the electric component 32 is formed by only the light reflected by the electric component 32.

The image-taking device used to take the image of the electric component 32 may be fixed in position, provided that the component-mounting heads 54 can be moved by the XY robot 48 on the machine base 12, to the position of the stationary image-taking device.

The nozzle-mounting device according to the present invention arranged for mounting the suction nozzle on the nozzle holder is equally applicable to an electric-component mounting system which uses only one component-mounting head, and an electric-component mounting system wherein a plurality of component-mounting heads are disposed at respective positions on a rotary body which is rotated about an axis by a suitable rotary drive device such that the component-mounting heads are sequentially stopped at a plurality of working stations that include a component-mounting station at which the electric component is mounted on the printed-wiring board. The axis of rotation of the rotary body may extend in the vertical direction or may be inclined with respect to the vertical direction. The rotary body may be intermittently rotated, or rotated by desired angles in the opposite directions. The rotary body may be mounted on an XY robot which is movable in a plane parallel to the surface of the printed-wiring board.

While the presently preferred embodiments of this invention have been described in detail, for illustrative purpose only, it is to be understood that the present invention may be embodied with various other changes, modifications and improvements, such as those described in the SUMMARY OF THE INVENTION, which may occur to those skilled in the art, without departing from the spirit and scope of the invention defined in the following claims:

What is claimed is:

1. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fitting portions being provided with a second abutting portion which is arranged to be brought into abutting contact with said first abutting portion in a direction intersecting axes of said first and second fitting portions; and a pressing device operable to force said inner and outer circumferential surfaces against each other in one radial direction of said first and second fitting portions by abutting contact of said first abutting portion with said second abutting portion, such that said inner and outer circumferential surfaces are held in contact with each other at predetermined one circumferential position of each of said inner and outer circumferential surfaces.

2. The nozzle-mounting device according to claim 1, wherein said second abutting portion includes a movable member supported by said nozzle holder such that said movable member is movable relative to said nozzle holder, and said pressing device includes a biasing device which biases said movable member in a direction for abutting contact with said first abutting portion, said nozzle holder being provided with a movable-member supporting device which movably supports said movable member.

3. The nozzle-mounting device according to claim 2, wherein said movable member is a pivotable member pivotable about a pivot axis thereof, and said biasing device includes an elastic member which acts on a portion of said pivotable member spaced from said pivot axis, to apply a pivoting torque to said pivotable member.

4. The nozzle-mounting device according to claim 1, wherein said first and second abutting portions are arranged to effect the abutting contact with each other on opposite sides of a plane which is parallel to said direction of the abutting contact and which includes said axes of said first and second fitting portions.

5. The nozzle-mounting device according to claim 2, wherein said pressing device includes a stop operable to define a maximum amount of movement of said movable member of said second abutting portion in a direction toward said first abutting portion.

6. The nozzle-mounting device according to claim 2, wherein a second biasing device which biases said suction nozzle and said nozzle holder in an axial direction away from each other is provided in addition to said biasing device of said pressing device provided as a first biasing device.

7. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fitting portions being provided with a second abutting portion which is arranged to be brought into abutting contact with said first abutting portion in a direction intersecting axes of said first and second fitting portions; and a pressing device operable to force said inner and outer circumferential surfaces against each other by abutting contact of said first abutting portion with said second abutting portion, wherein said first and second abutting portions are arranged to effect the abutting contact with each other in a direction which is inclined with respect to a plane perpendicular to said axes of said first and second fitting portions, such that the abutting contact causes an axial force to be generated for forcing said suction nozzle and said nozzle holder toward each other in an axial direction thereof, and wherein said pressing device includes:

a movable-member supporting device which supports a movable member of said second abutting portion such that said movable member is movable in said direction intersecting said axes of said first and second fitting portions;

a first biasing device which biases said movable member in a direction for abutting contact with said first abutting portion;

a stop operable to define a maximum amount of movement of said movable member by a biasing force of said first biasing device in a direction toward said first abutting portion; and a second biasing device which biases said suction nozzle and said nozzle holder in the axial direction away from each other, and wherein the abutting contact of said movable member of said second abutting portion and said first abutting portion with each other in the direction inclined with respect to said plane generates an axial force which acts on said suction nozzle in the axial direction toward said nozzle holder.

8. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fitting portions being provided with a second abutting portion which is arranged to be brought into abutting contact with said first abutting portion in a direction intersecting axes of said first and second fitting portions; and a pressing device operable to force said inner and outer circumferential surfaces against each other by abutting contact of said first abutting portion with said second abutting portion, wherein said suction nozzle includes said first fitting portion having said inner circumferential surface, while said nozzle holder includes said second fitting portion having said outer circumferential surface, and wherein said first fitting portion of said suction nozzle is provided with two first abutting portions located on opposite sides of a plane which is parallel to said direction of the abutting contact and which includes the axis of said first fitting portion, while said second fitting portion is provided with two second abutting portions for abutting contact with said two first abutting portions.

9. The nozzle-mounting device according to claim 8, wherein said two first abutting portions consist of two projecting pins which extend from an outer circumferential surface of said first fitting portion in opposite directions such that said two projecting pins are coaxial with each other.

10. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fining portions being provided with a second abutting portion which is arranged to be brought into abutting contact with said first abutting portion in a direction intersecting axes of said first and second fitting portions; and a pressing device operable to force said inner and outer circumferential surfaces against each other by abutting contact of said first abutting portion with said second abutting portion, wherein said suction nozzle includes said second fitting portion having said outer circumferential surface, while said nozzle holder includes said first fitting portion having said inner circumferential surface, and wherein said first abutting portion provided on said second fitting portion of said suction nozzle is formed on said outer circumferential surface so as to extend in a direction which is inclined with respect to a plane perpendicular to the axis of said second fitting portion, such that the abutting contact of said first abutting portion with said second abutting portion generates an axial force which acts on said suction nozzle in an axial direction toward said nozzle holder, and said first fitting portion of said nozzle holder has an opening which permits said second abutting portion to be brought into abutting contact with said first abutting portion.

11. The nozzle-mounting device according to claim 10, wherein said first abutting portion is a side surface of a cutout formed in said outer circumferential surface of said second fitting portion.

12. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fitting portions being provided with a second abutting portion which is arranged to be brought into abutting contact with said first abutting portion in a direction intersecting axes of said first and second fitting portions; and a pressing device operable to force said inner and outer circumferential surfaces against each other by abutting contact of said first abutting portion with said second abutting portion, and wherein said second abutting portion includes at least one roller rotatable about an axis perpendicular to the axes of said first and second fitting portions.

13. A nozzle-mounting device for removably mounting, on a nozzle holder, a suction nozzle for holding an electric component by suction under a negative pressure, said nozzle-mounting device comprising:

said nozzle holder including one of a first fitting portion and a second fitting portion which respectively have an inner circumferential surface and an outer circumferential surface and which are arranged to effect a fitting engagement with each other at said inner and outer circumferential surfaces, said suction nozzle including the other of said first and second fitting portions;

one of said first and second fitting portions being provided with a first abutting portion located at an axially intermediate portion of mutually fitting parts of said inner and outer circumferential surfaces, while the other of said first and second fitting portions being provided with a second abutting portion which is arranged to be brought into abutting contact with said first abutting portion in a direction intersecting axes of said first and second fitting portions; and a pressing device operable to force said inner and outer circumferential surfaces against each other by abutting contact of said first abutting portion with said second abutting portion, and wherein a low-friction coating having a lower friction coefficient than said first and second fitting portions is formed on at least one of said inner and outer circumferential surfaces.

14. A nozzle-mounting device according to claim 13, wherein said first fitting portion of said nozzle holder is provided with two first abutting portions located on opposite sides of a plane which is parallel to said direction of the abutting contact and which includes the axis of said first abutting portion, while said second fitting portion of said nozzle holder is provided with two second abutting portions for abutting contact with said two first abutting portions.

* * * * *